US009679991B2

(12) United States Patent
Jun et al.

(10) Patent No.: US 9,679,991 B2
(45) Date of Patent: Jun. 13, 2017

(54) METHOD FOR MANUFACTURING SEMICONDUCTOR DEVICE USING GATE PORTION AS ETCH MASK

(71) Applicant: Samsung Electronics Co., Ltd., Suwon-si (KR)

(72) Inventors: Hwi-Chan Jun, Yongin-si (KR); Deok-Han Bae, Anyang-si (KR); Hyun-Seung Song, Incheon (KR); Seung-Seok Ha, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 29 days.

(21) Appl. No.: 14/670,324

(22) Filed: Mar. 26, 2015

(65) Prior Publication Data

US 2016/0020303 A1 Jan. 21, 2016

(30) Foreign Application Priority Data

Jul. 16, 2014 (KR) .................. 10-2014-0089747

(51) Int. Cl.
*H01L 21/336* (2006.01)
*H01L 29/66* (2006.01)
*H01L 21/768* (2006.01)
*H01L 21/311* (2006.01)

(52) U.S. Cl.
CPC .. *H01L 29/66795* (2013.01); *H01L 21/31144* (2013.01); *H01L 21/76897* (2013.01); *H01L 29/6656* (2013.01); *H01L 29/66545* (2013.01)

(58) Field of Classification Search
CPC ........... H01L 21/0332; H01L 21/31144; H01L 21/32115; H01L 21/76897; H01L 21/823456; H01L 21/823828; H01L 21/823437; H01L 29/66795; H01L 29/66545; H01L 29/6656
See application file for complete search history.

(56) References Cited

U.S. PATENT DOCUMENTS

| | | |
|---|---|---|
| 6,337,275 B1 | 1/2002 | Cho et al. |
| 6,624,065 B2 | 9/2003 | Jang et al. |
| 6,638,805 B2 | 10/2003 | Park et al. |
| 8,048,790 B2 | 11/2011 | Soss et al. |
| 8,232,607 B2 | 7/2012 | Edge et al. |
| 8,373,239 B2 | 2/2013 | Siddiqui et al. |
| 8,421,077 B2 | 4/2013 | Jain et al. |
| 8,435,891 B2 | 5/2013 | Engel et al. |

(Continued)

FOREIGN PATENT DOCUMENTS

| | | |
|---|---|---|
| JP | 2000-307001 A | 11/2000 |
| KR | 10-2000-0002141 A | 1/2000 |

(Continued)

*Primary Examiner* — Matthew Gordon
(74) *Attorney, Agent, or Firm* — Muir Patent Law, PLLC

(57) ABSTRACT

Embodiments of the disclosure relate to a method for manufacturing a semiconductor device including a field effect transistor with improved electrical characteristics. According to embodiments of the disclosure, self-aligned contact plugs may be effectively formed using a metal hard mask portion disposed on a gate portion. In addition, a process margin of a photoresist mask for the formation of the self-aligned contact plugs may be improved by using the metal hard mask portion.

19 Claims, 39 Drawing Sheets

(56) References Cited

U.S. PATENT DOCUMENTS

| | | |
|---|---|---|
| 8,492,811 B2 | 7/2013 | Booth, Jr. et al. |
| 8,536,040 B1 | 9/2013 | Park |
| 8,564,030 B2 | 10/2013 | Schultz |
| 8,759,920 B2 | 6/2014 | Wann et al. |
| 2007/0066047 A1 | 3/2007 | Ye et al. |
| 2011/0281426 A1 | 11/2011 | Kim et al. |
| 2012/0122286 A1 | 5/2012 | Kim et al. |
| 2013/0119474 A1 | 5/2013 | Schultz |
| 2013/0149830 A1 | 6/2013 | Rhee et al. |
| 2013/0181292 A1* | 7/2013 | Sardesai ............ H01L 21/82342 257/368 |
| 2013/0270648 A1 | 10/2013 | Manabe |
| 2013/0320399 A1 | 12/2013 | Chang et al. |
| 2013/0320452 A1* | 12/2013 | Wann ................ H01L 21/82342 257/368 |
| 2015/0079774 A1* | 3/2015 | Chang ............... H01L 21/76816 438/586 |

FOREIGN PATENT DOCUMENTS

| | | |
|---|---|---|
| KR | 10-2005-0010227 A | 1/2005 |
| KR | 10-2006-0000595 A | 1/2006 |
| KR | 10-2006-0077989 A | 7/2006 |
| KR | 10-2013-0063997 A | 6/2013 |
| KR | 10-2013-0135698 A | 12/2013 |

\* cited by examiner

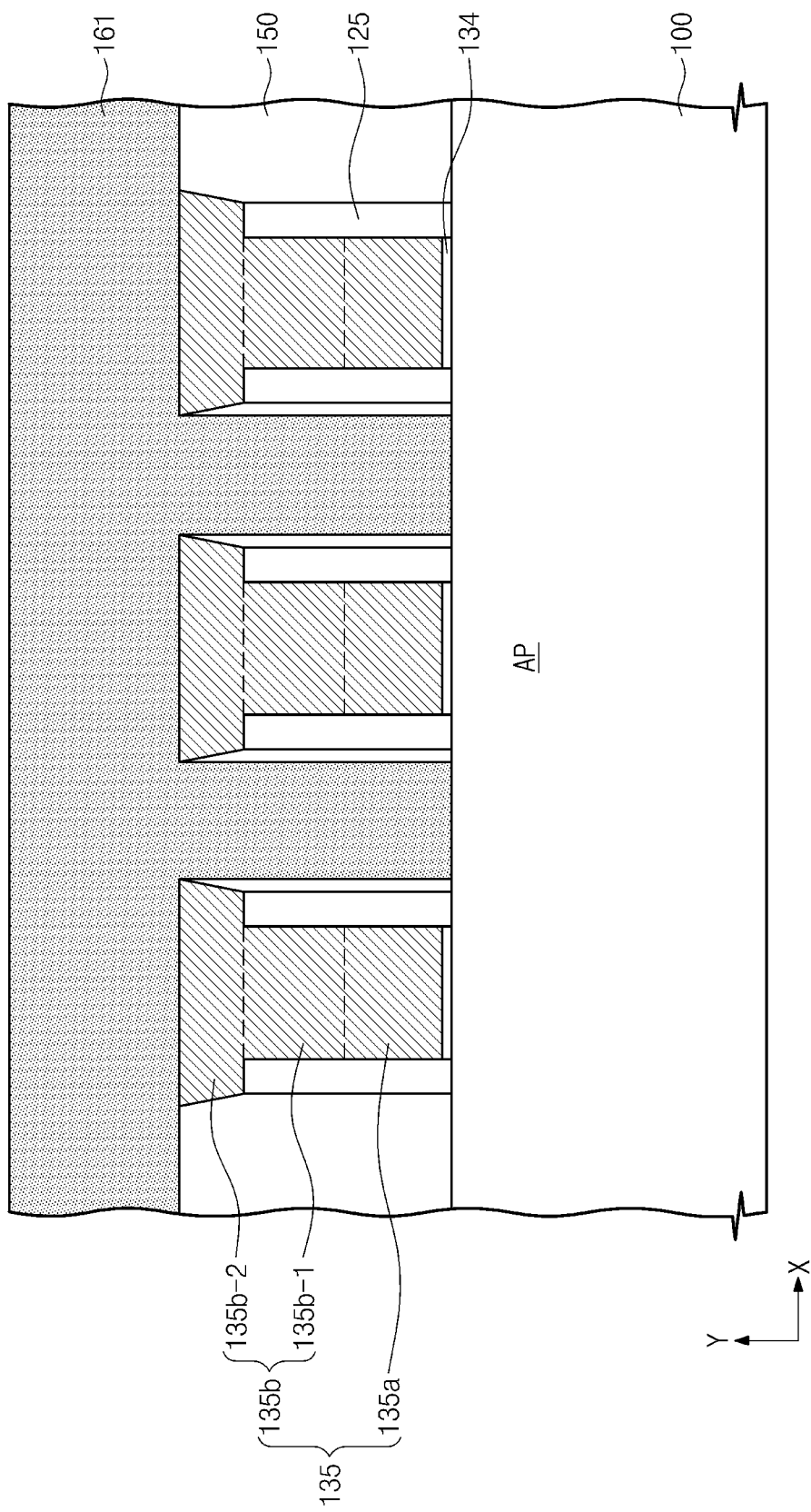

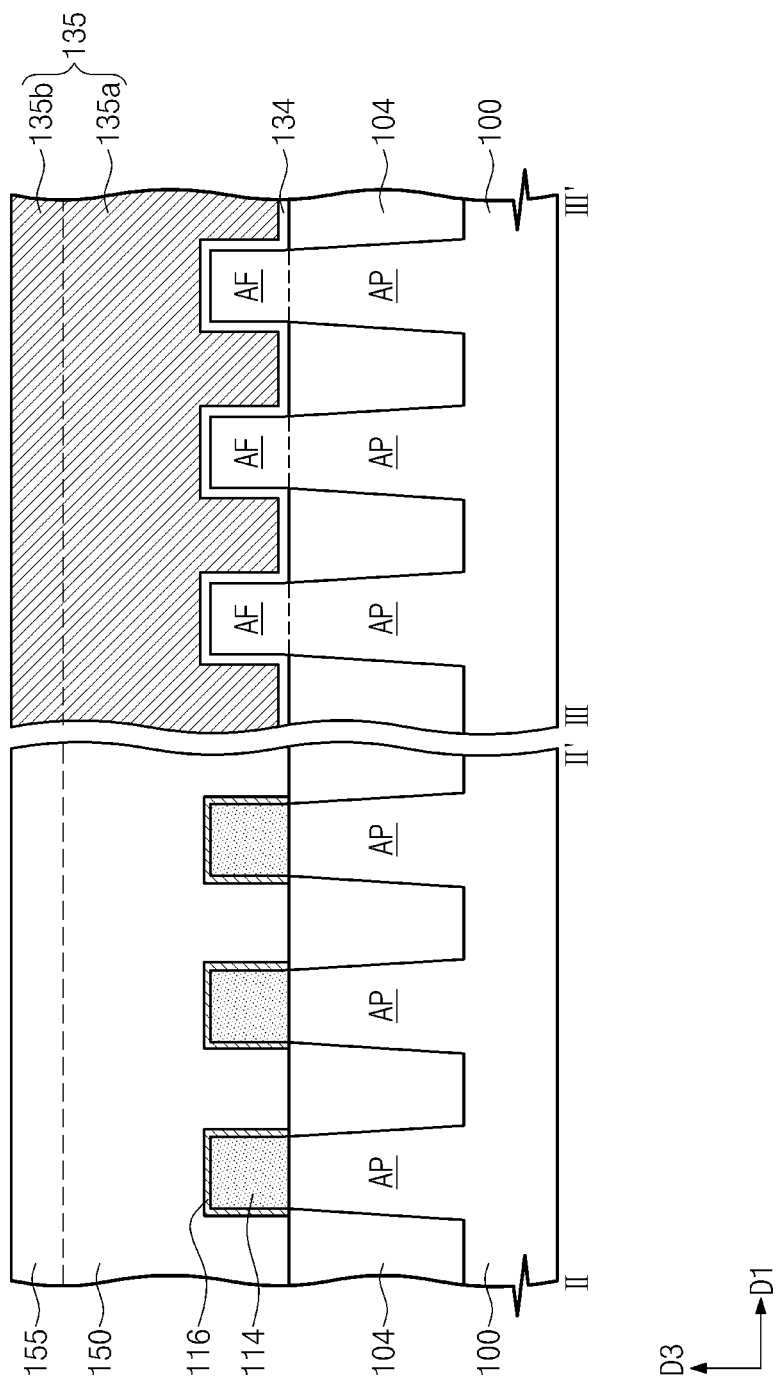

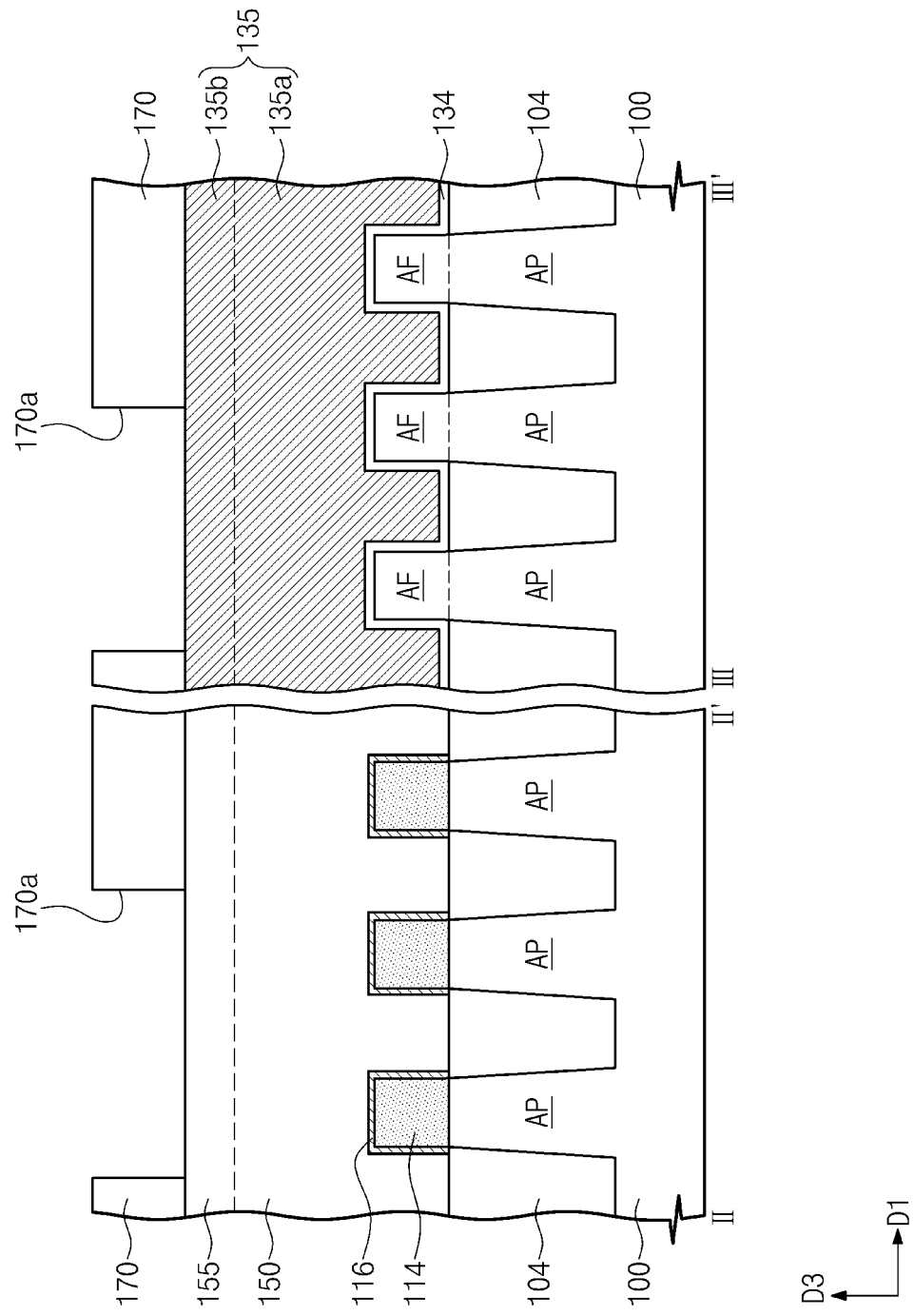

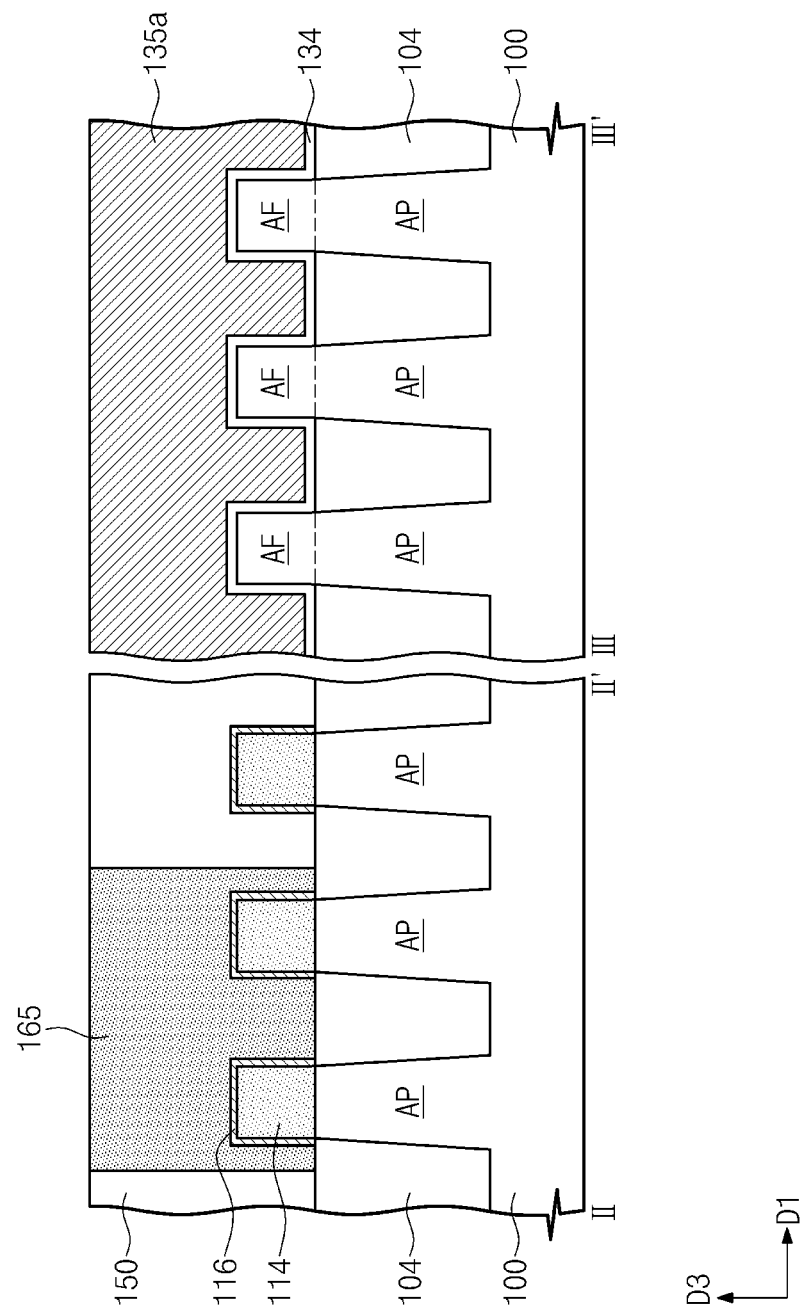

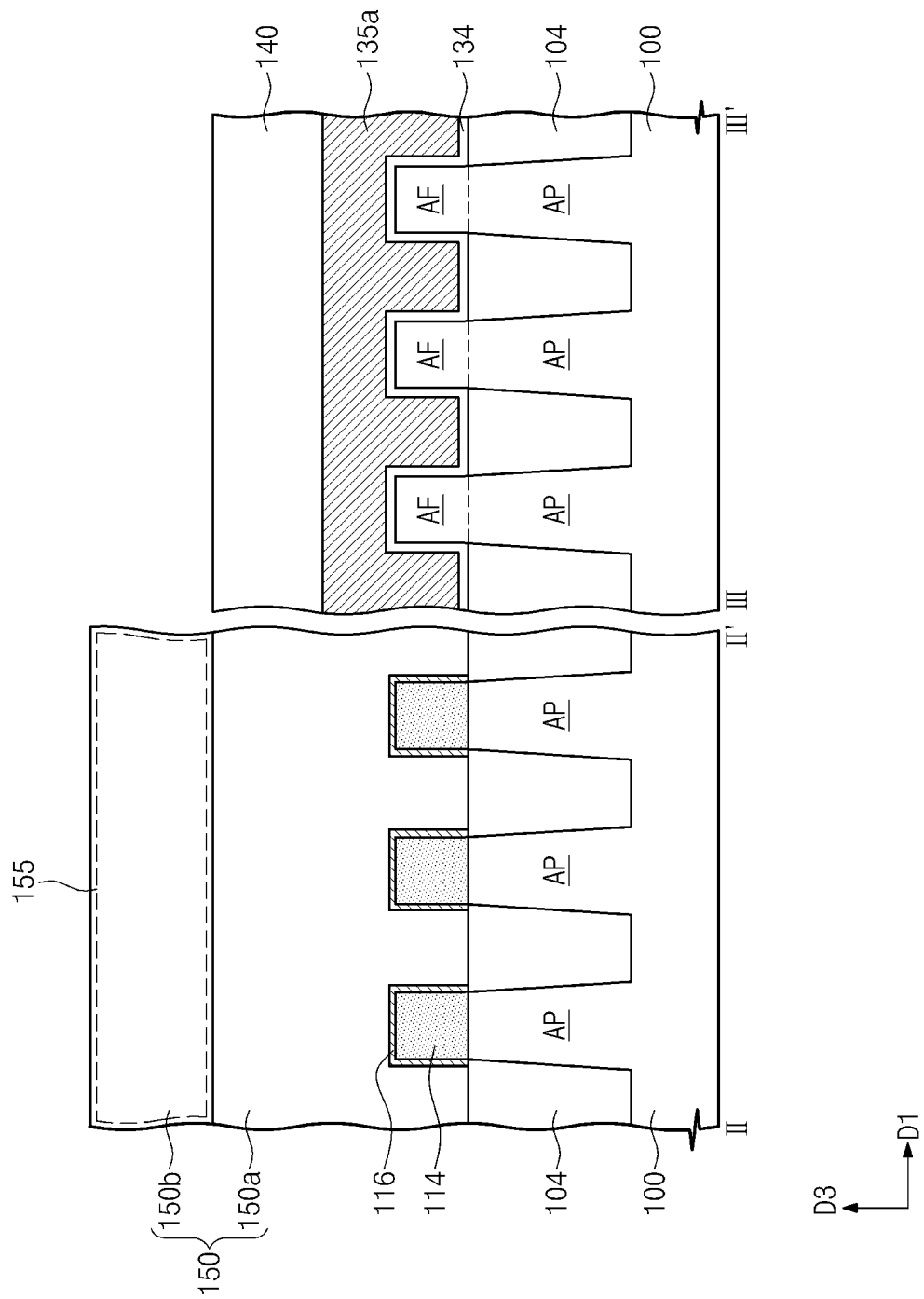

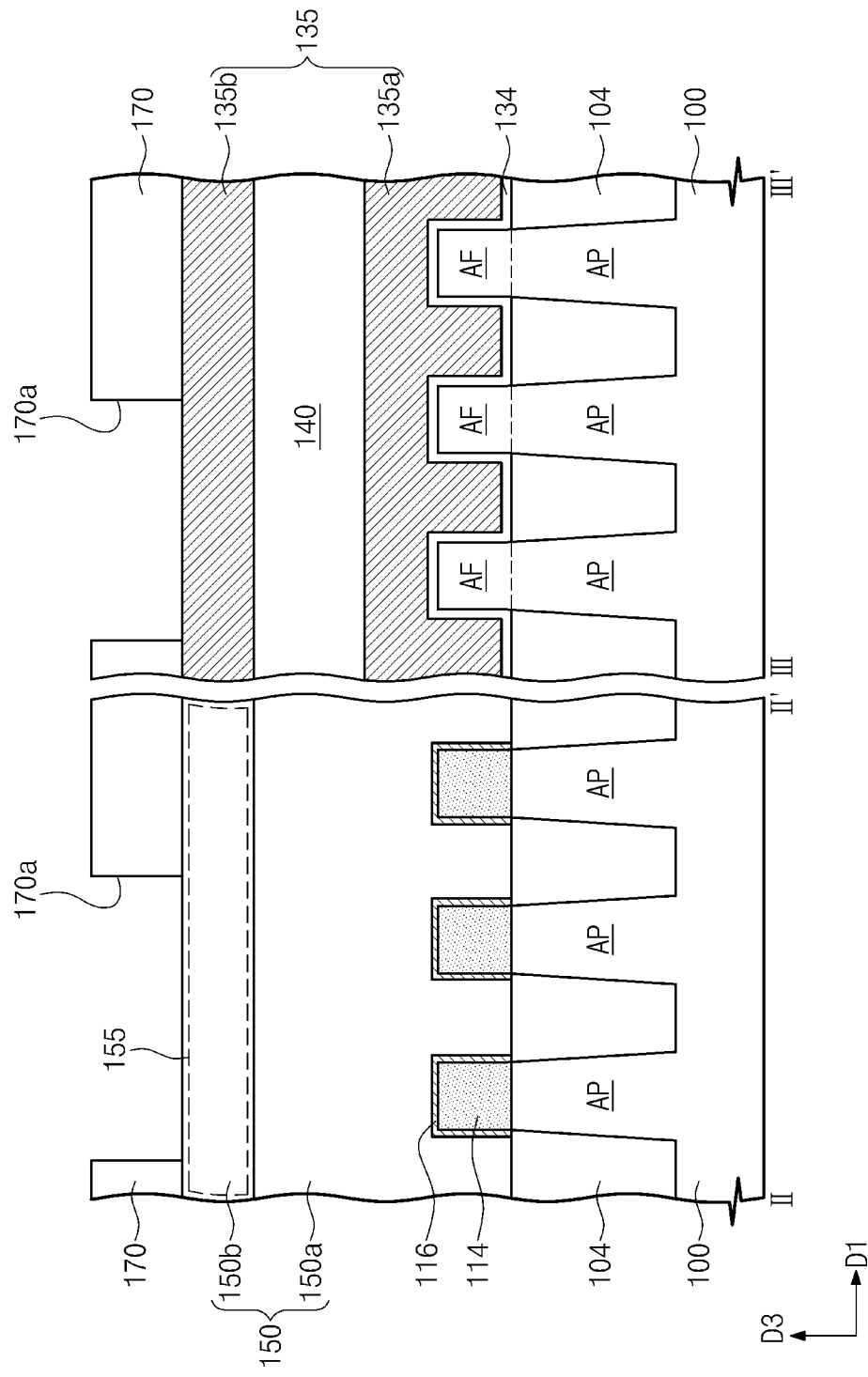

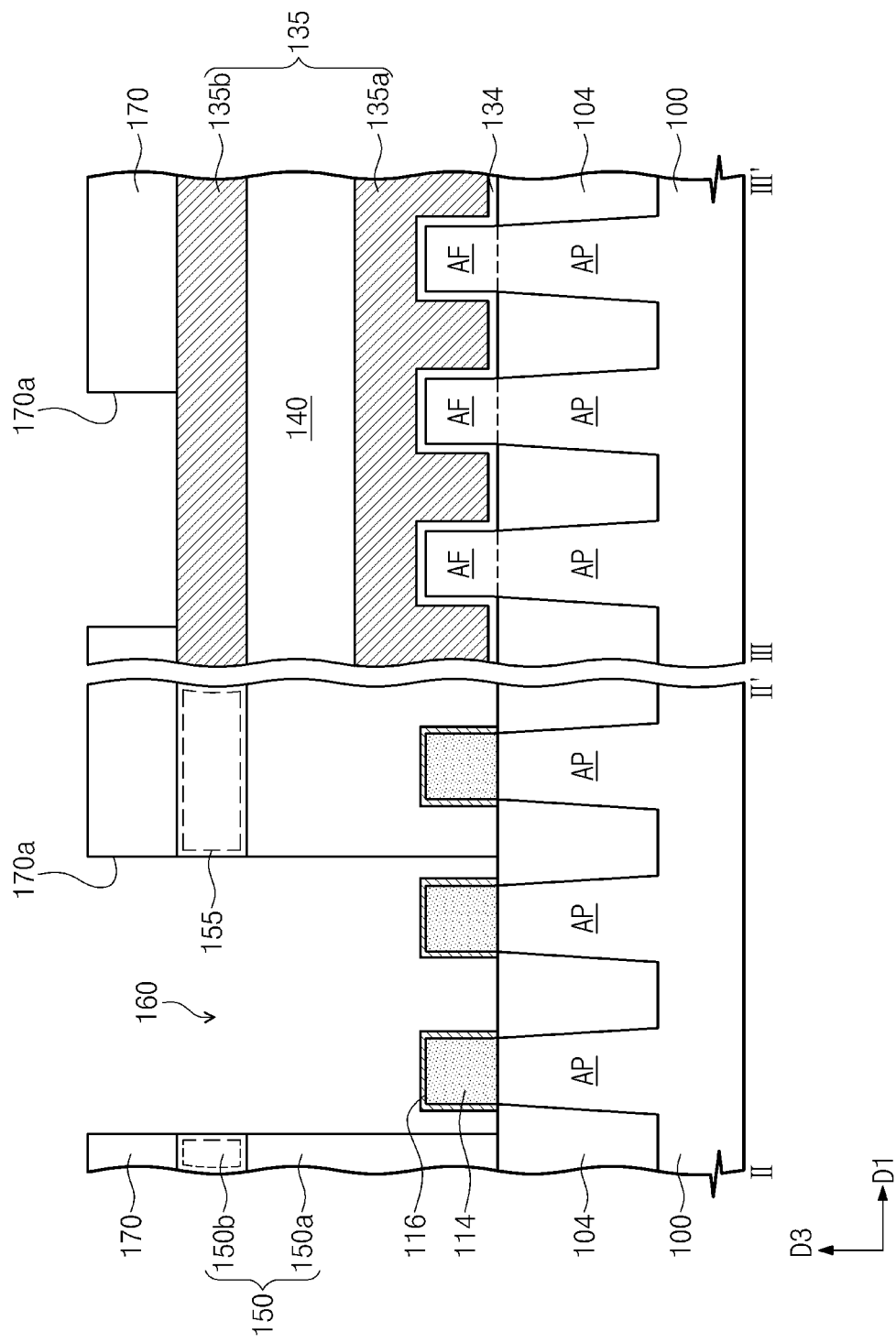

METHOD FOR MANUFACTURING SEMICONDUCTOR DEVICE USING GATE PORTION AS ETCH MASK

CROSS-REFERENCE TO RELATED APPLICATION

This U.S. non-provisional patent application claims priority under 35 U.S.C. §119 to Korean Patent Application No. 10-2014-0089747, filed on Jul. 16, 2014, in the Korean Intellectual Property Office, the disclosure of which is hereby incorporated by reference in its entirety.

BACKGROUND

The present disclosure relates to a semiconductor device and a method for manufacturing the same. More particularly, the present disclosure relates to a semiconductor device including a field effect transistor and a method for manufacturing the same.

Semiconductor memory devices are widely used in an electronic industry because of their small size, multi-function characteristic, and/or low manufacture costs. Semiconductor devices may be categorized as any one of semiconductor memory devices storing logic data, semiconductor logic devices processing logic data, and hybrid semiconductor devices having both the function of the semiconductor memory devices and the function of the semiconductor logic devices. Semiconductor devices with good characteristics have been demanded with the development of the electronic industry. For example, high-reliable, high-speed and/or multi-functional semiconductor devices have been increasingly demanded. To satisfy these demands, semiconductor devices have been more and more complicated in structure and have been highly integrated.

SUMMARY

Embodiments of the disclosure may provide a method for manufacturing a semiconductor device including a field effect transistor with improved electrical characteristics.

In one aspect, a method for manufacturing a semiconductor device may include: forming first and second insulating patterns on a substrate, each of the insulating patterns protruding in a direction perpendicular to a top surface of the substrate; forming a conductive pattern between the insulating patterns, the conductive pattern including a gate portion and a metal hard mask portion on the gate portion; forming a first spacer between the conductive pattern and the first insulating pattern and a second spacer between the conductive pattern and the second insulating pattern, wherein each of the spacers may extend vertically from the top surface of the substrate; forming contact holes penetrating the insulating patterns by etching the insulating patterns using the metal hard mask portion as an etch mask; and forming contact plugs filling the contact holes, respectively. A top surface of the metal hard mask portion may vertically overlap with respective top surfaces of the spacers.

In some embodiments, each of the insulating patterns may include a protrusion. A top surface of the protrusion may be substantially coplanar with the top surface of the metal hard mask portion, and the top surface of the protrusion may be higher than the top surfaces of the spacers.

In some embodiments, the metal hard mask portion may cover upper portions of respective first sidewalls of the spacers, the top surfaces of the spacers, and upper portions of respective first sidewalls of the insulating patterns. A first width of the metal hard mask portion at a level higher than the top surfaces of the spacers may be greater than a second width of the metal hard mask portion at a level lower than the top surfaces of the spacers.

In some embodiments, a width of the protrusion starting at a level at the top surfaces of the spacers may become progressively less from a bottom toward a top of the protrusion, and a width of the metal hard mask portion at a level at the top surfaces of the spacers may become progressively greater toward the top surface of the metal hard mask portion.

In some embodiments, forming the conductive pattern may include: forming a metal layer covering the insulating patterns; and planarizing the metal layer until the insulating patterns are exposed, thereby forming the metal hard mask portion.

In some embodiments, the method may further include: forming epitaxial patterns on the substrate at both sides of the conductive pattern. The contact holes may expose the epitaxial patterns.

In some embodiments, the conductive pattern may be provided in plurality. Forming the contact holes may include: forming a photoresist mask on the insulating patterns and the conductive patterns, the photoresist mask including an opening that exposes portions of the metal hard mask portions and portions of the insulating patterns; and forming the contact holes using the exposed portions of the metal hard mask portions and the photoresist mask as an etch mask. In this case, at least one of the contact holes may vertically overlap with at least two epitaxial patterns that are spaced apart from each other in one direction parallel to the top surface of the substrate.

In some embodiments, at least one of the contact plugs may have a bar shape extending in the first direction and may be connected to at least two epitaxial patterns spaced apart from each other in the first direction.

In some embodiments, the method may further include forming an active fin by patterning the substrate. The conductive pattern may intersect the active fin.

In some embodiments, forming the active fin may include: patterning the substrate to form device isolation trenches; forming a device isolation layer filling the device isolation trenches; and recessing a top surface of the device isolation layer to form device isolation patterns of which top surfaces are lower than the top surface of the substrate.

In some embodiments, forming the conductive pattern may include: forming a sacrificial gate pattern on the substrate; removing the sacrificial gate pattern to form a recess region between the spacers; forming a gate dielectric layer and a metal layer filling the recess region on an entire top surface of the substrate; and planarizing the metal layer until the insulating patterns are exposed, thereby forming the gate portion and the metal hard mask portion. The gate portion and the metal hard mask portion may be in one united body.

In some embodiments, forming the contact plugs may include: forming a conductive layer filling the contact holes on an entire top surface of the substrate; and planarizing the conductive layer and the conductive pattern to remove the metal hard mask portion and to form the contact plugs. Top surfaces of the contact plugs may be substantially coplanar with a top surface of the gate portion and the top surfaces of the spacers.

In some embodiments, forming the conductive pattern may include: forming a sacrificial gate pattern on the substrate; and replacing the sacrificial gate pattern with the gate portion.

In some embodiments, forming the first and second insulating patterns may include: forming interlayer insulating patterns covering a first sidewall of each of the spacers; and depositing a capping layer on an entire top surface of the substrate to form a first capping pattern covering a top surface of the gate portion and to form second capping patterns covering top surfaces of the interlayer insulating patterns and the top surfaces of the spacers. Each of the insulating patterns may include the interlayer insulating pattern and the second capping pattern which are sequentially stacked.

In some embodiments, forming the conductive pattern may further include: forming a metal layer covering top surfaces of the first and second capping patterns; and planarizing the metal layer until the second capping patterns are exposed, thereby forming the metal hard mask portion. In this case, the metal hard mask portion may be vertically spaced apart from the gate portion with the first capping pattern interposed therebetween. A width of the top surface of each of the second capping patterns at the same level as the top surface of the metal hard mask portion may be substantially equal to or smaller than a width of the top surface of each of the interlayer insulating patterns when viewed from a plan view.

In another aspect, a method for manufacturing a semiconductor device may include: forming a conductive pattern on a substrate having an active pattern, the conductive pattern including a gate portion and a metal hard mask portion on the gate portion, and the conductive pattern intersecting the active pattern; forming epitaxial patterns and insulating patterns, the epitaxial patterns disposed on the substrate at opposite sides of the conductive pattern, and the insulating patterns disposed on the epitaxial patterns; forming contact holes using the metal hard mask portion as an etch mask, the contact holes penetrating the insulating patterns and exposing the epitaxial patterns; forming a conductive layer filling the contact holes on an entire top surface of the substrate; and planarizing the conductive layer and the conductive patterns to remove the metal hard mask portion and to form contact plugs in the contact holes at the same time. The contact plugs may be laterally spaced apart from the gate portion.

In some embodiments, the epitaxial patterns may constitute first and second columns that are parallel to a first direction parallel to a top surface of the substrate, and the first and second columns may be spaced apart from each other in a second direction intersecting the first direction. In this case, forming the contact holes may include: forming a photoresist mask including an opening on the insulating patterns and the conductive pattern, the opening vertically overlapping with the first and second columns; and forming the contact holes using the photoresist mask and the metal hard mask portion exposed by the opening as an etch mask.

In some embodiments, the contact plugs may include a first contact plug overlapping with the epitaxial patterns of the first column; and a second contact plug overlapping with the epitaxial patterns of the second column. The first contact plug and the second contact plug may be spaced apart from each other in the second direction with the gate portion interposed therebetween.

In some embodiments, forming the conductive pattern may include: forming a recess region that penetrates an interlayer insulating layer and exposes a top surface of the substrate; forming a metal layer filling the recess region on an entire top surface of the substrate; and planarizing the metal layer until the insulating patterns are exposed, thereby forming the gate portion and the metal hard mask portion. A width of an upper portion of the metal hard mask portion may be greater than a width of the gate portion.

In some embodiments, forming the conductive pattern may include: forming a recess region that penetrates an interlayer insulating layer and exposes a top surface of the substrate; forming the gate portion partially filling the recess region; depositing a capping layer to form a first capping pattern filling the rest of the recess region and to form second capping patterns covering top surfaces of the insulating patterns; and forming the metal hard mask portion covering a top surface of the first capping pattern and a first sidewall of one of the second capping patterns.

In still another aspect, a method for manufacturing a semiconductor device may include: first and second insulating patterns on a substrate, each of the insulating patterns protruding in a direction perpendicular to a top surface of the substrate; forming a conductive pattern between the first and second insulating patterns; forming a first spacer between the conductive pattern and the first insulating pattern, and a second spacer between the conductive pattern and the second insulating pattern; and forming contact holes penetrating the insulating patterns by etching the insulating patterns using the conductive pattern. Respective top surfaces of the spacers may vertically overlap with a top surface of the conductive pattern such that the respective top surfaces of the spacers may vertically be aligned with and below the top surface of the conductive pattern.

BRIEF DESCRIPTION OF THE DRAWINGS

Aspects of the inventive concepts will become more apparent in view of the attached drawings and accompanying detailed description.

FIGS. 1A to 1E are cross-sectional views illustrating a method for manufacturing a semiconductor device according to some example embodiments of the inventive concepts;

FIGS. 2A to 9A are plan views illustrating a method for manufacturing a semiconductor device according to other example embodiments of the inventive concepts;

FIGS. 2B to 9B are cross-sectional views taken along lines I-I' of FIGS. 2A to 9A, respectively, to illustrate a method for manufacturing a semiconductor device according to other example embodiments of the inventive concepts;

FIGS. 2C to 9C are cross-sectional views taken along lines II-II' and III-III' of FIGS. 2A to 9A, respectively, to illustrate a method for manufacturing a semiconductor device according to other example embodiments of the inventive concepts;

FIGS. 11A to 18A are cross-sectional views corresponding to lines I-I' of FIGS. 10 and 4A to 9A to illustrate a method for manufacturing a semiconductor device according to still other example embodiments of the inventive concepts;

FIGS. 11B to 18B are cross-sectional views corresponding to lines II-II' and III-III' of FIGS. 10 and 4A to 9A to illustrate a method for manufacturing a semiconductor device according to still other example embodiments of the inventive concepts.

DETAILED DESCRIPTION OF THE EMBODIMENTS

Figure 1A:
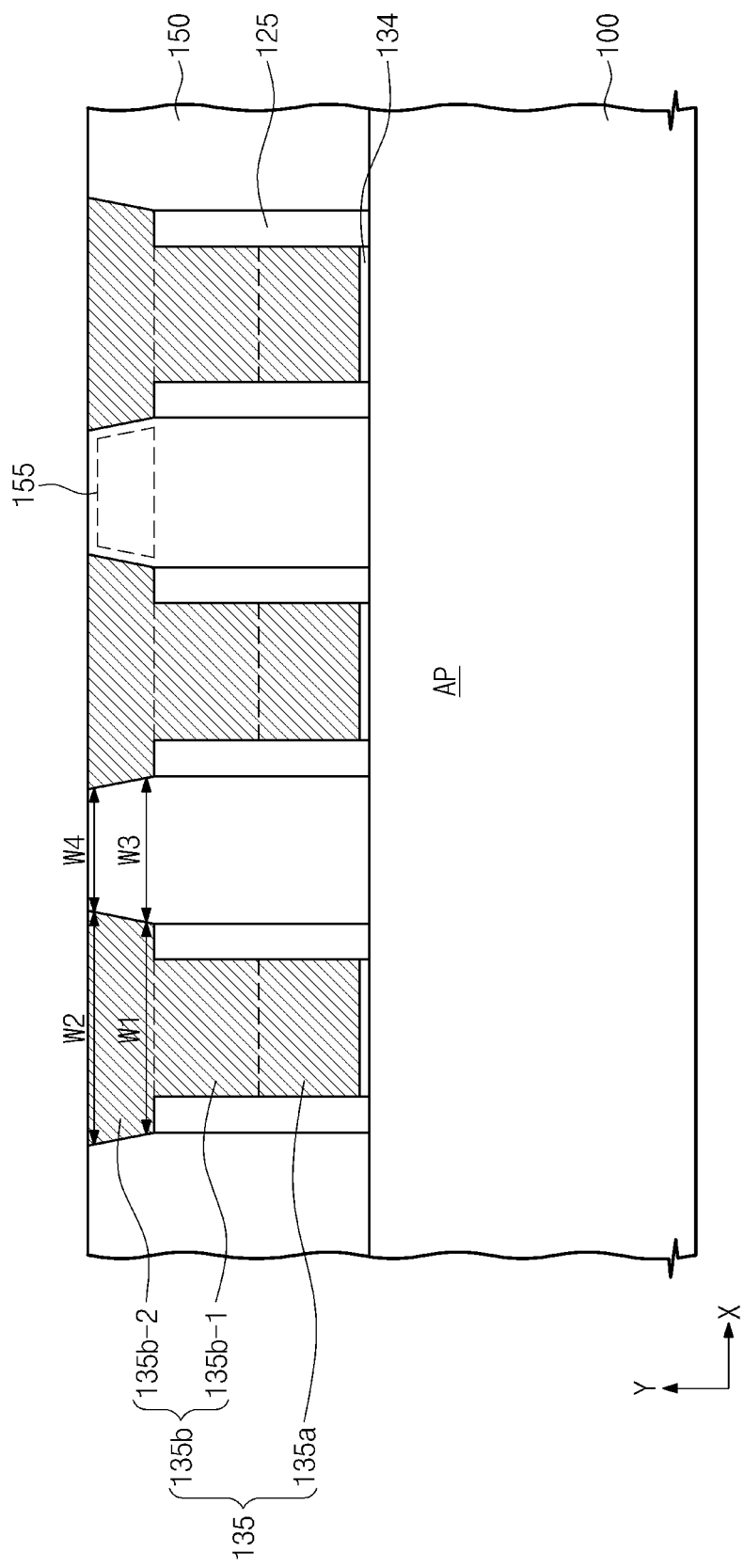

The disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose examples of the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element or on another element, it may be directly connected or coupled to or on the other element or intervening elements may be present. In contrast, when an element is referred to as being "directly connected" or "directly coupled" to another element or on another element, there are no intervening elements present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise.

It will be further understood that the terms such as "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Expressions such as "at least one of," when preceding a list of elements, modify the entire list of elements and do not modify the individual elements of the list.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the disclosure are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIGS. 1A to 1E are cross-sectional views illustrating a method for manufacturing a semiconductor device according to some example embodiments of the inventive concepts.

As used herein, a semiconductor device may refer to any of the various devices such as shown in FIGS. 1A through 18B, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

Referring to FIG. 1A, a substrate 100 may be provided. The substrate 100 may be a semiconductor substrate including, for example, silicon, germanium, or silicon-germanium. Alternatively, the substrate 100 may be a compound semiconductor substrate. Even though not shown in the drawings, device isolation patterns (not shown) may be formed in the substrate 100 to define an active pattern AP. The device isolation patterns may be formed using, for example, a shallow trench isolation (STI) method.

The active pattern AP may correspond to a portion of the substrate 100 that is surrounded by the device isolation patterns. The active pattern AP may have a line or bar shape that extends in a first direction X parallel to a top surface of the substrate 100. One active pattern AP is illustrated in FIG. 1A. Alternatively, the active pattern AP may be provided in plurality. The active pattern AP may be doped with dopants of a first conductive type.

Spacers 125 may be formed to define regions in which conductive patterns 135 are to be formed. Forming the spacers 125 may include forming a spacer layer (not shown) on the substrate 100 and anisotropically etching the spacer layer.

Insulating patterns 150 that protrude in a second direction Y perpendicular to the top surface of the substrate 100 may be formed on the substrate 100. Each of the insulating patterns 150 may be disposed between the spacers 125. The insulating patterns 150 may cover outer sidewalls of the spacers 125. Forming the insulating patterns 150 may include forming an interlayer insulating layer (not shown) on the substrate 100 and planarizing the interlayer insulating layer. Even though not shown in the drawings, epitaxial patterns (not shown) may be formed on the active pattern AP vertically overlapping with the insulating patterns 150. The epitaxial patterns may be disposed under the insulating patterns 150, respectively. The epitaxial patterns will be described later in more detail.

Each of the insulating patterns 150 may include a protrusion 155 that corresponds to its upper portion. For example, each of the insulating patterns 150 may include a first portion corresponding to a lower portion and a second portion corresponding to an upper portion. The protrusion 155 may refer to the second portion compared to the first portion, top portion compared to bottom, or tapered portion compared to straight portion. The protrusions 155 may be formed, for example, by selectively etching upper portions of the spacers 125. When the spacers 125 are selectively etched, upper portions (i.e., the protrusions 155) of the insulating patterns 150 may be partially etched. Thus, a width W3 of the protrusion 155 at a bottom of the protrusion 155 may be greater than a width W4 of the protrusion 155 at a top surface of the protrusion 155. The protrusion 155 may be disposed at a higher level than top surfaces of the spacers 125.

In one embodiment, conductive patterns 135 may be formed on the substrate 100. Each of the conductive patterns 135 may be formed between a pair of spacers 125. Forming the conductive patterns 135 may include forming sacrificial gate patterns (not shown) on the substrate 100, removing the sacrificial gate patterns, and forming the conductive patterns 135 in regions formed by removing the sacrificial gate patterns. In more detail, recess regions (not shown) may be formed between the spacers 125 by removing the sacrificial gate patterns. Thereafter, a metal layer (not shown) may be formed to fill the recess regions and to cover the insulating patterns 150, and the metal layer may be planarized to form the conductive patterns 135.

In some embodiments, each of the conductive patterns 135 may include a gate portion 135a adjacent to the top surface of the substrate 100 and a metal hard mask portion 135b vertically spaced apart from the top surface of the substrate 100 with the gate portion 135a interposed therebetween. In the present embodiment, the gate portion 135a and the metal hard mask portion 135b may constitute one united body. In other embodiments, the gate portion 135a and the metal hard mask portion 135b may be individually formed to constitute the conductive pattern 135. Each of the conductive patterns 135 may have a line or bar shape that extends to intersect the active pattern AP.

In some embodiments, each of the conductive patterns 135 may include a first portion corresponding to the gate portion 135a, and a second portion corresponding to the metal hard mask portion 135b. In one embodiment, the first portion of the conductive patterns 135 may have a rectangular shaped portion, and the second portion of the conductive patterns 135 may have a T shaped portion, when viewed from a cross-section view. A bottom of the second portion may be the same height as a top of the first portion.

In some embodiments, each of the conductive patterns 135 may include a first portion corresponding to the gate portion 135a, and second and third portions 135b_1 and 135b_2 corresponding to the metal hard mask portion 135b. Each of the first and second portions of the conductive patterns 135 may have a rectangular shaped portion, and the third portion 135b_2 may have a tapered shape portion, when viewed from a cross-section view. A bottom of the third portion 135b_2 may be the same height as a top of the second portion 135b_1, and a bottom of the second portion 135b_1 may be the same height as a top of the first portion 135a of the conductive patterns 135.

The metal hard mask portion 135b may be disposed on the gate portion 135a between the protrusions 155 adjacent thereto. A top surface of the metal hard mask portion 135b may coplanar with top surfaces of the protrusions 155. In addition, the metal hard mask portion 135b may cover upper portions of sidewalls of the spacers 125, top surfaces of the spacers 125, and upper portions of sidewalls of the insulating patterns 150 which are adjacent thereto. The top surface of the metal hard mask portion 135b may vertically overlap with the top surfaces of the spacers 125. A top surface of the third portion 135b_2 of the metal hard mask portion 135b may be horizontally extended such that it vertically overlaps each of the top surfaces of the spacers 125.

The width of the protrusion 155 may become progressively less from a bottom toward a top of the protrusion 155. Thus, a width of an upper portion, which is disposed at a side of the protrusion 155, of the metal hard mask portion 135b may become progressively greater from a bottom toward a top thereof. For example, a width W1 of the second portion 135b_2 of the metal hard mask portion 135b at a bottom surface of the second portion 135b_2 may be smaller than a width W2 of the second portion 135b_2 of the metal hard mask portion 135b at a top surface of the second portion 135b_2.

A width of the first portion 135b_1, which is disposed between the spacers 125, of the metal hard mask portion 135b may be smaller than the first and second widths W1 and W2. In addition, the width of the first portion 135b_1 of the metal hard mask portion 135b may be substantially equal to a width of the gate portion 135a.

The metal hard mask portions 135b may be formed of a material having a high etch selectivity with respect to the insulating patterns 150. For example, the metal hard mask portions 135b may include at least one of a metal nitride (e.g., titanium nitride or tantalum nitride) or a metal material (e.g., titanium, tantalum, tungsten, copper, or aluminum). In the event that the metal hard mask portions 135b and the gate portions 135a are formed at the same time, the gate portion 135a may include the same material as the metal hard mask portion 135b. In one embodiment, the metal hard mask portions 135b may be deposited on the gate portion 135a in a separate process. In this case, a material of the metal hard mask portions 135b may be different from a material of the gate portion 135a.

A gate dielectric layer 134 may be formed between the conductive pattern 135 and the substrate 100. The gate dielectric layer 134 may be formed to cover a bottom surface of the recess region (not shown) before a metal layer (not shown) for the conductive pattern 135 is deposited. The gate dielectric layer 134 will be described later in more detail.

Figure 1B:
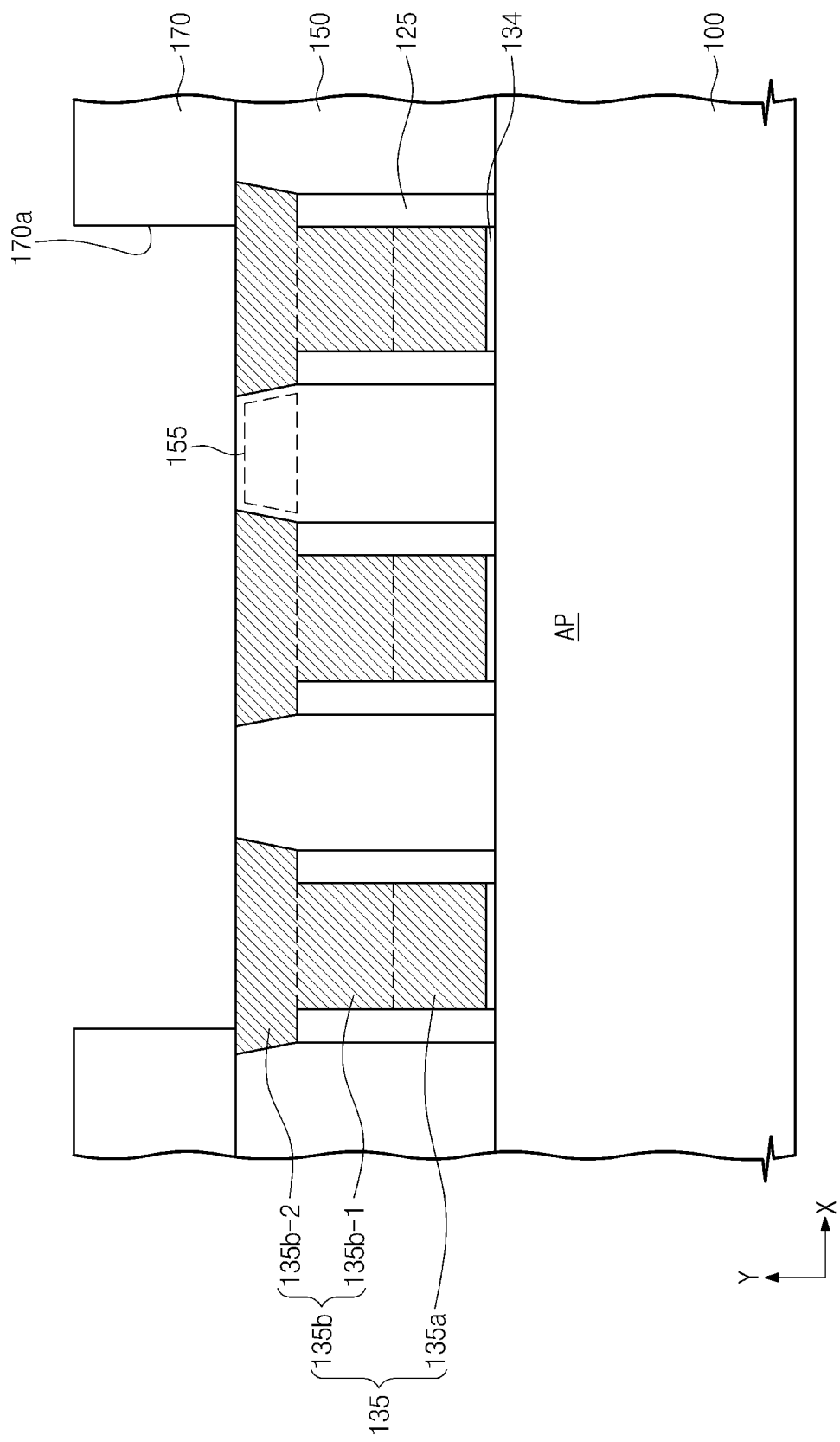

Referring to FIG. 1B, a photoresist mask 170 may be formed on the insulating pattern 150 and the conductive patterns 135. The photoresist mask 170 may include an opening 170a that expose portions of the metal hard mask portions 135b and portions of the insulating patterns 150.

Figure 1C:
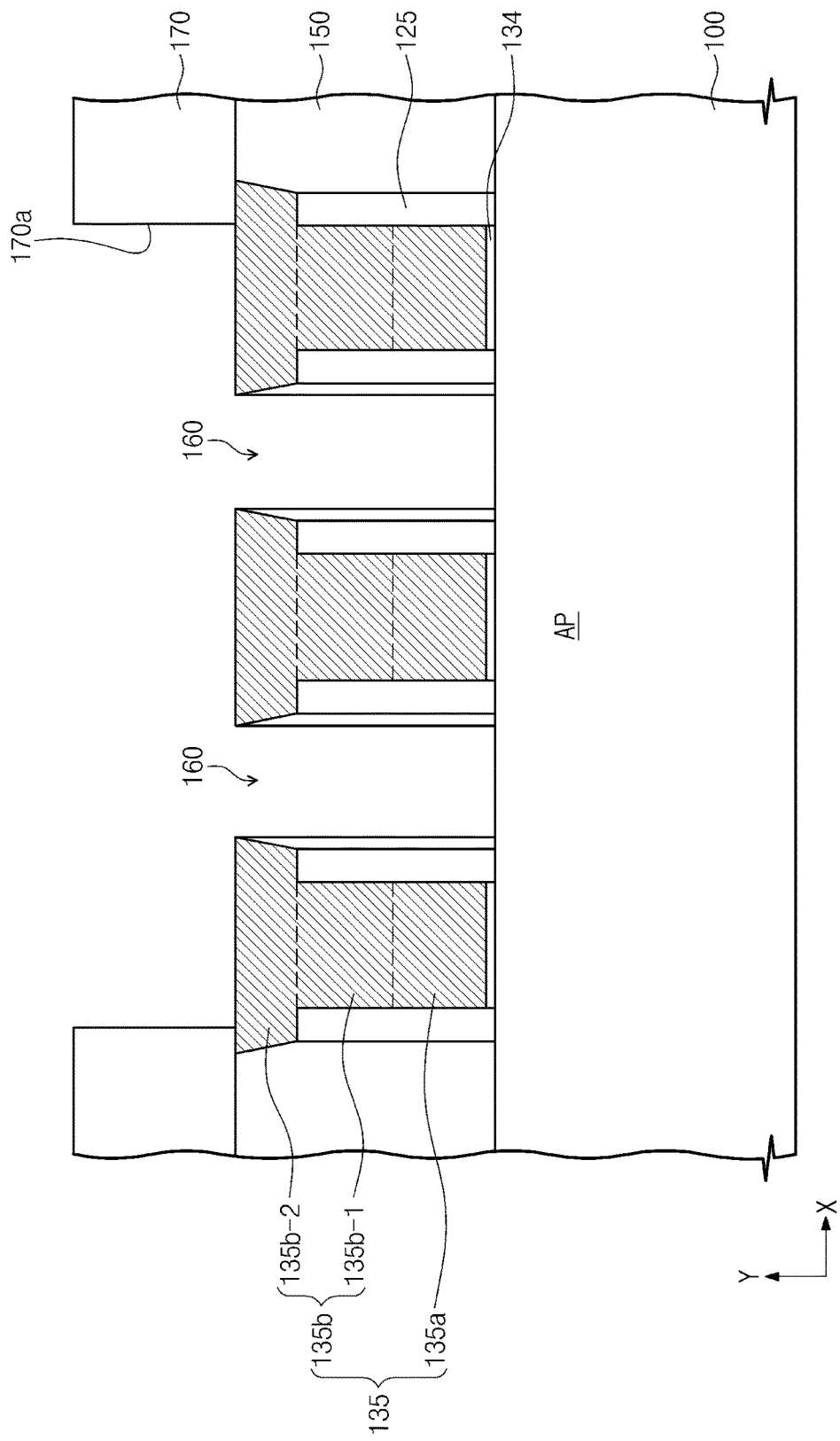

Referring to FIG. 1C, contact holes 160 that penetrate the insulating patterns 150 may be formed to vertically overlap with the opening 170a. In more detail, the insulating patterns 150 vertically overlapping with the opening 170a may be anisotropically etched using the photoresist mask 170 as an etch mask. At this time, the metal hard mask portions 135b vertically overlapping with the opening 170a may also be used as the etch mask for etching the insulating patterns 150. This is because the metal hard mask portions 135b include a metal material having a high etch selectivity with respect to the insulating patterns 150. The contact holes 160 may expose the top surface of the substrate 100.

As described above, the metal hard mask portions 135b may vertically overlap the spacers 125 and the gate portions 135a. Thus, the spacers 125 and the gate portions 135a disposed under the metal hard mask portions 135b may not be etched due to the metal hard mask portion 135b during the etching process for the formation of the contact holes 160. For example, the spacers 125 vertically overlapping with the opening 170a may remain after the etching process, so the contact holes 160 may be horizontally spaced apart from the gate portions 135a with the spacers 125 interposed therebetween. For example, each of the contact holes 160 may be a self-aligned contact hole that is self-aligned by the metal hard mask portions 135b. In addition, a planar shape of the contact hole 160 may not correspond to a planar shape of the opening 170a due to the metal hard mask portions 135b. As a result, a process margin of the photoresist mask 170 for the formation of the contact holes 160 may be improved by the metal hard mask portions 135b.

Referring to FIG. 1D, a conductive layer 161 may be formed to fill the contact holes 160. The photoresist mask 170 may be removed before the formation of the conductive layer 161. The conductive layer 161 may be deposited on an entire top surface of the substrate 100. Forming the conductive layer 161 may include sequentially depositing a barrier metal layer (e.g., a metal nitride layer) and a contact metal layer (e.g., a tungsten layer).

Figure 1E:
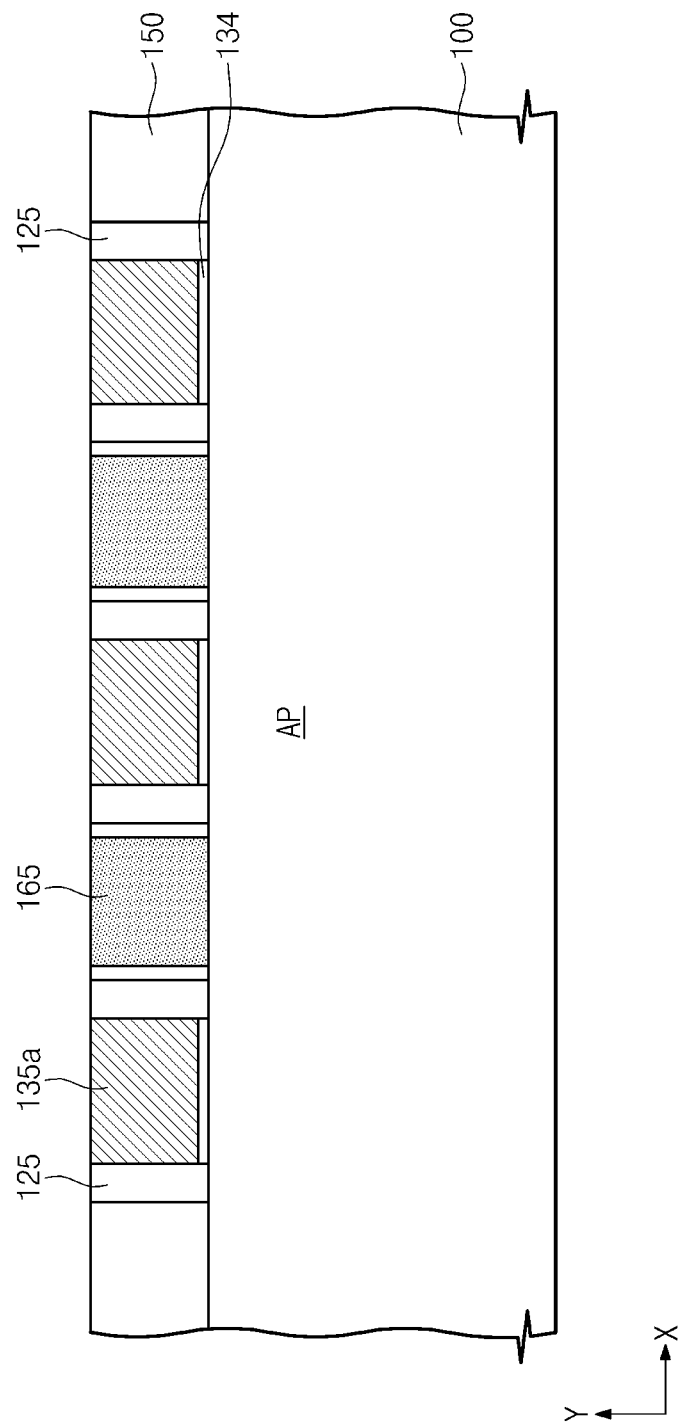

Referring to FIG. 1E, the conductive layer 161 and the conductive patterns 135 may be planarized to form contact plugs 165. At the same time, all the metal hard mask portions 135b may be removed. As a result, the gate portions 135a may remain on the substrate 100. The contact plugs 165 may be laterally spaced apart from the gate portions 135a with the spacers 125 interposed therebetween. As described above, each of the contact plugs 165 may be a self-aligned contact plug that is self-aligned by the metal hard mask portions 135b. In the event that the epitaxial patterns (not shown) are formed on the active pattern AP, the contact plugs 165 may be connected to the epitaxial patterns, respectively.

FIGS. 2A to 9A are plan views illustrating a method for manufacturing a semiconductor device according to other example embodiments of the inventive concepts. FIGS. 2B to 9B are cross-sectional views taken along lines I-I' of FIGS. 2A to 9A, respectively, to illustrate a method for manufacturing a semiconductor device according to other example embodiments of the inventive concepts. FIGS. 2C to 9C are cross-sectional views taken along lines II-II' and III-III' of FIGS. 2A to 9A, respectively, to illustrate a method for manufacturing a semiconductor device according to other example embodiments of the inventive concepts. In the present embodiment, the same technical features as described with reference to FIGS. 1A to 1E will be omitted or mentioned briefly for the purpose of ease and convenience in explanation. In other words, differences between the present embodiment and the embodiment of FIGS. 1A to 1E will be mainly described. Hereinafter, the same elements as mentioned in the embodiment of FIGS. 1A to 1E will be indicated by the same reference numerals or the same reference designators.

Figure 2A:
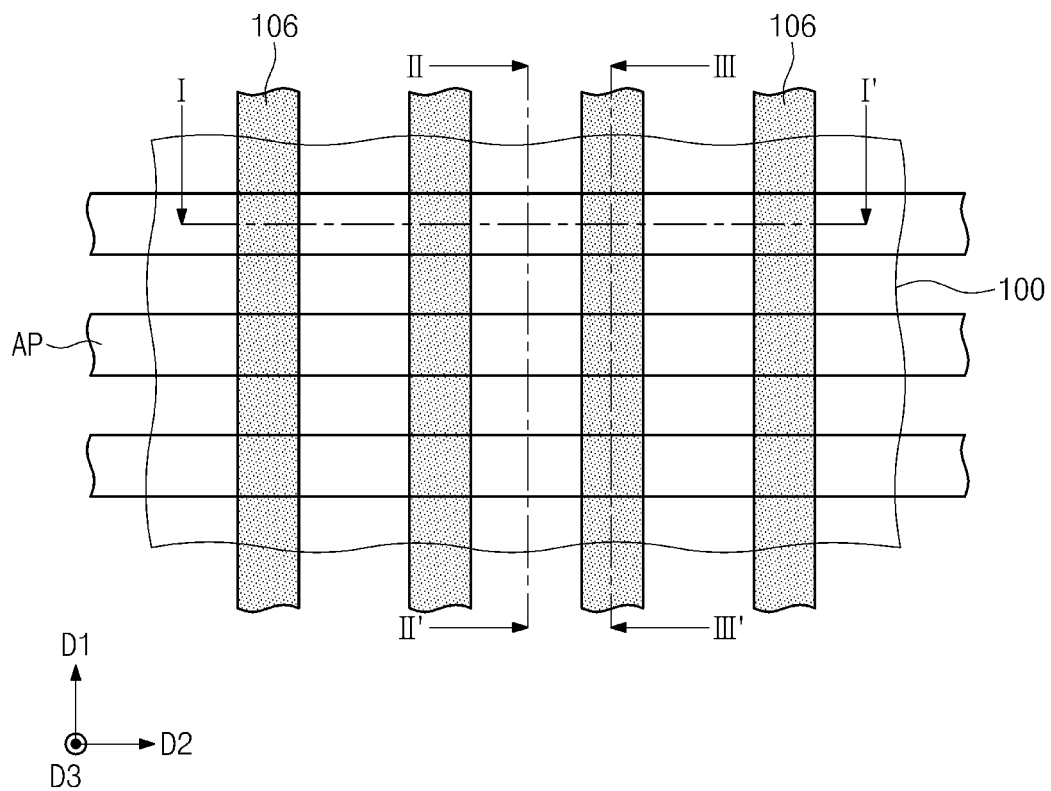
Figure 2B:
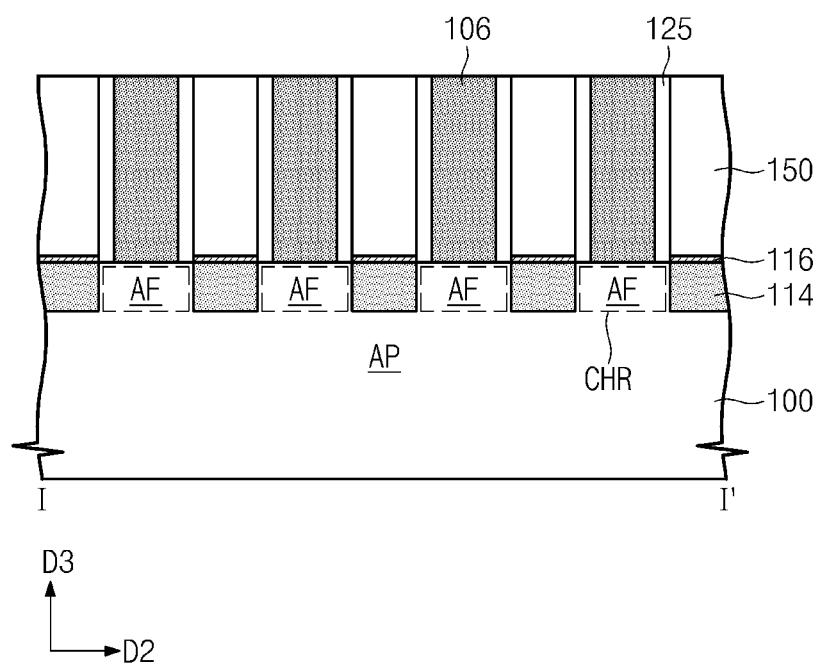
Figure 2C:
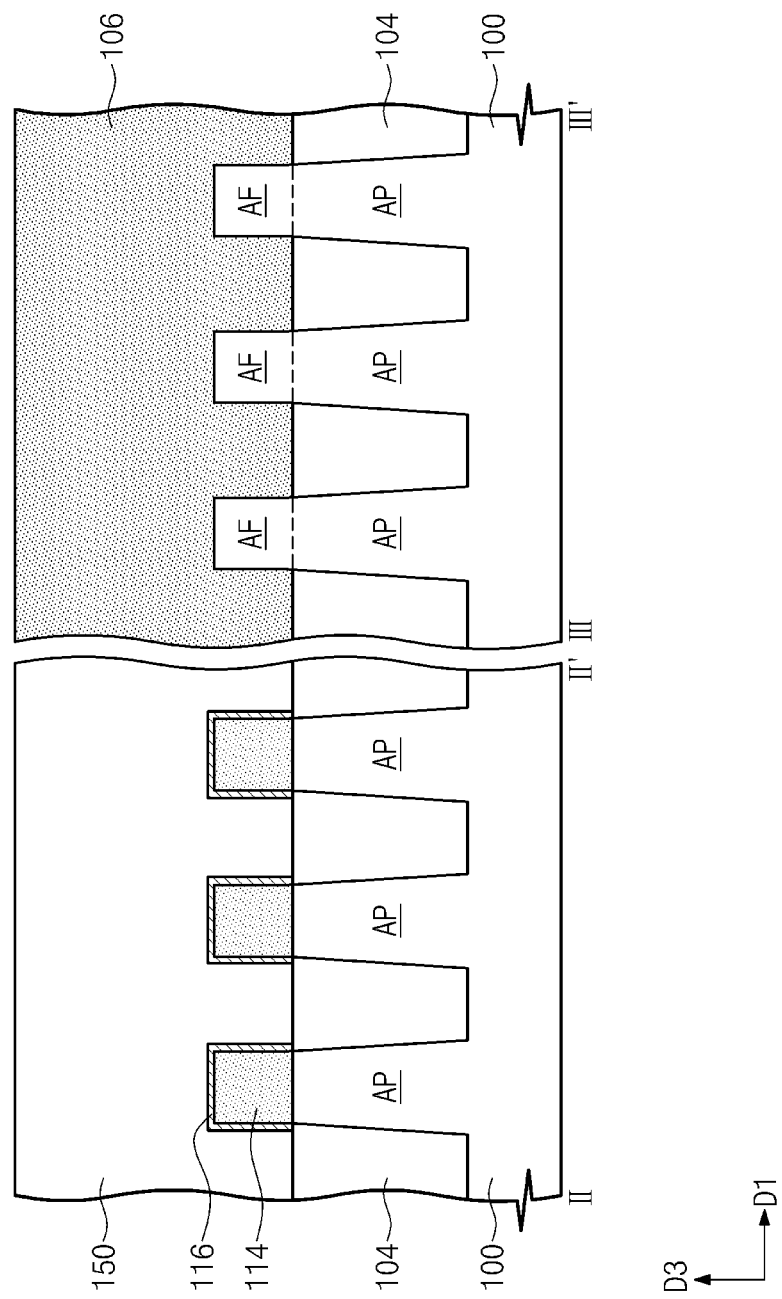

Referring to FIGS. 2A, 2B, and 2C, device isolation patterns 104 may be formed in a substrate 100 to define active patterns AP. The substrate 100 may be a semiconductor substrate including, for example, silicon, germanium, or silicon-germanium. Alternatively, the substrate 100 may be a compound semiconductor substrate. The device isolation patterns 104 may be formed by, for example, a STI method. For example, trenches may be formed in the substrate 100, and the device isolation patterns 104 may be formed to fill the trenches. The device isolation patterns 104 may include an insulating material such as a silicon oxide layer. Each trench may be formed to have an aspect ratio of, for example, 5 or more. In some embodiments, each trench may become progressively narrower toward its bottom. Thus, each active pattern AP may have a shape that becomes progressively narrower toward its top. The active patterns AP may be doped with dopants of a first conductivity type.

Some upper portions (hereinafter, referred to as 'active fins AF') of the active patterns AP may be exposed. Exposing the active fins AF may include recessing top surfaces of the device isolation patterns 104 by a wet etching technique. The top surfaces of the device isolation patterns 104 may be recessed using an etch recipe having an etch selectivity with respect to the active patterns AP.

Sacrificial gate patterns 106 may be formed on the active fins AF. In some embodiments, a sacrificial gate layer may be deposited on the active fins AF and the device isolation patterns 104, and it may be patterned to form the sacrificial gate patterns 106. For example, the sacrificial gate layer may include, for example, a poly-silicon layer.

The sacrificial gate patterns 106 may be formed to cross over the active fins AF. Thus, channel regions CHR and source/drain regions may be defined in the active fins AF. The channel region CHR may correspond to a portion of the active fin AF that is disposed under the sacrificial gate pattern 106, and the source/drain regions may correspond to portions of the active fin AF that are disposed at both sides of the sacrificial gate pattern 106 and are horizontally spaced apart from each other with the channel region CHR interposed therebetween.

Spacers 125 may be formed on both sidewalls of each of the sacrificial gate patterns 106. In some embodiments, a spacer layer may be conformally formed on the substrate 100 having the sacrificial gate patterns 106, and a blanket anisotropic etching process may be performed on the spacer layer to form the spacers 125. The spacer layer may include at least one of, for example, $SiO_2$, SiCN, SiCON, or SiN. In other embodiments, the spacer layer may include a plurality of layers of which each includes at least one of, for example, $SiO_2$, SiCN, SiCON, or SiN.

Epitaxial patterns 114 may be formed at opposite sides of each of the sacrificial gate patterns 106. The epitaxial patterns 114 may correspond to source/drains of a field effect transistor according to embodiments of the inventive concepts. The epitaxial patterns 114 may be formed at positions of the source/drain regions of the active fins AF. Thus, the channel region CHR of the active fin AF may be disposed between the epitaxial patterns 114.

Forming the epitaxial patterns 114 may include removing the source/drain regions of the active fins AP and performing a selective epitaxial growth (SEG) process using the substrate 100 as a seed layer. The epitaxial patterns 114 may be doped with dopants of a second conductivity type different from the first conductive type of the active patterns AP. Unlike FIGS. 2B and 2C, top surfaces of the epitaxial patterns 114 may have a curvature that is not zero (0). In some embodiments, each of the epitaxial patterns 114 may have an upwardly convex top surface.

The epitaxial patterns 114 may include a different semiconductor element from the substrate 100. For example, the epitaxial patterns 114 may include a semiconductor element of which a lattice constant is larger or smaller than that of the semiconductor element of the substrate 100. Since the epitaxial patterns 114 include the different semiconductor element from the substrate 100, a compressive force or a tensile force may be applied to the channel regions CHR. In some embodiments, if the substrate 100 is a silicon substrate and the epitaxial patterns 114 include, for example, silicon-germanium or germanium, the compressive force may be applied to the channel regions CHR. In this case, the field effect transistor including the epitaxial patterns 114 may be a PMOS transistor. In other embodiments, if the substrate 100 is a silicon substrate and the epitaxial patterns 114 include, for example, silicon carbide (SiC), the tensile force may be applied to the channel regions CHR. In this case, the field effect transistor including the epitaxial patterns 114 may be an NMOS transistor. Since the epitaxial patterns 114 apply the compressive force or the tensile force to the channel regions CHR, the mobility of carriers generated in the channel regions CHR may be improved when the field effect transistor according to embodiments of the inventive concepts is operated.

Subsequently, semiconductor capping patterns 116 may be formed on the epitaxial patterns 114, respectively. The semiconductor capping patterns 116 may be formed of the same semiconductor element as the substrate 100 or the epitaxial patterns 114. For example, the semiconductor capping patterns 116 may include silicon or silicon-germanium. Even though not shown in the drawings, a metal silicide may be formed on each of the semiconductor capping patterns 116. The metal silicide may be formed by reaction between a metal with the semiconductor element included in the semiconductor capping pattern 116.

Insulating patterns 150 protruding in a third direction D3 may be formed on the substrate 100 having the semiconductor capping patterns 116. The third direction D3 may be perpendicular to first and second directions D1 and D2 parallel to the top surface of the substrate 100. For example, the third direction D3 may be perpendicular to the top surface of the substrate 100. A first interlayer insulating layer covering the sacrificial gate patterns 106 may be formed on an entire top surface of the substrate 100, and a planarization process may be performed on the first interlayer insulating layer until top surfaces of the sacrificial gate patterns 106, thereby forming the insulating patterns 150. The first interlayer insulating layer may include a silicon oxide layer and may be formed by a flowable chemical vapor deposition (FCVD) process. The planarization process of the first interlayer insulating layer may be performed using an etch-back process or a chemical mechanical polishing (CMP) process.

Figure 3A:
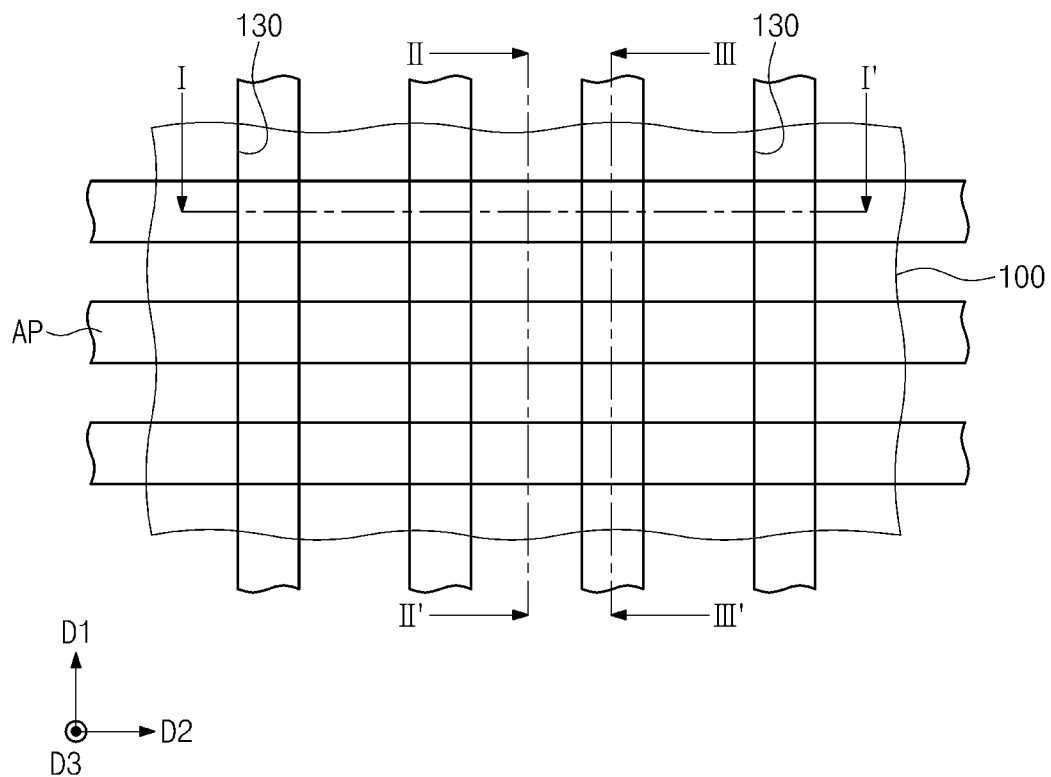
Figure 3B:
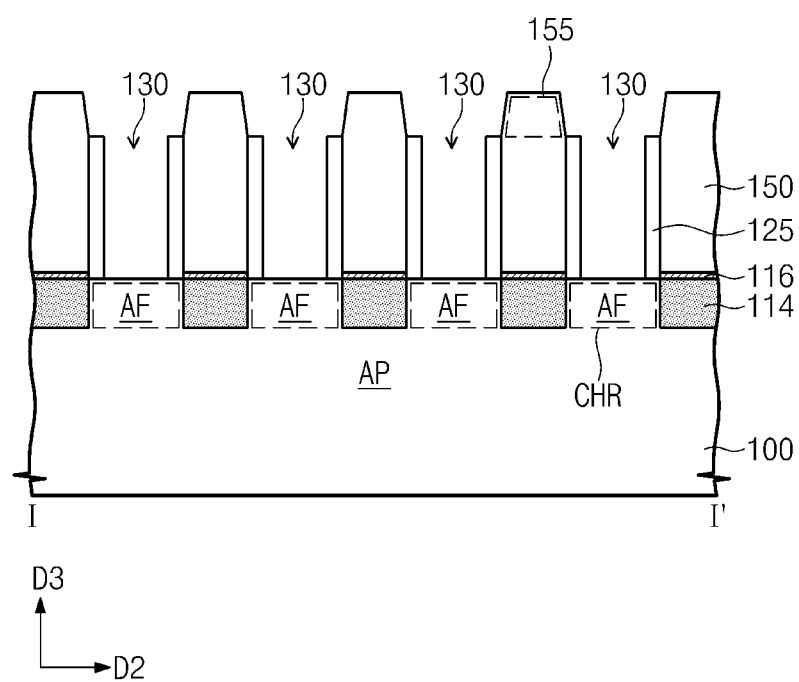
Figure 3C:
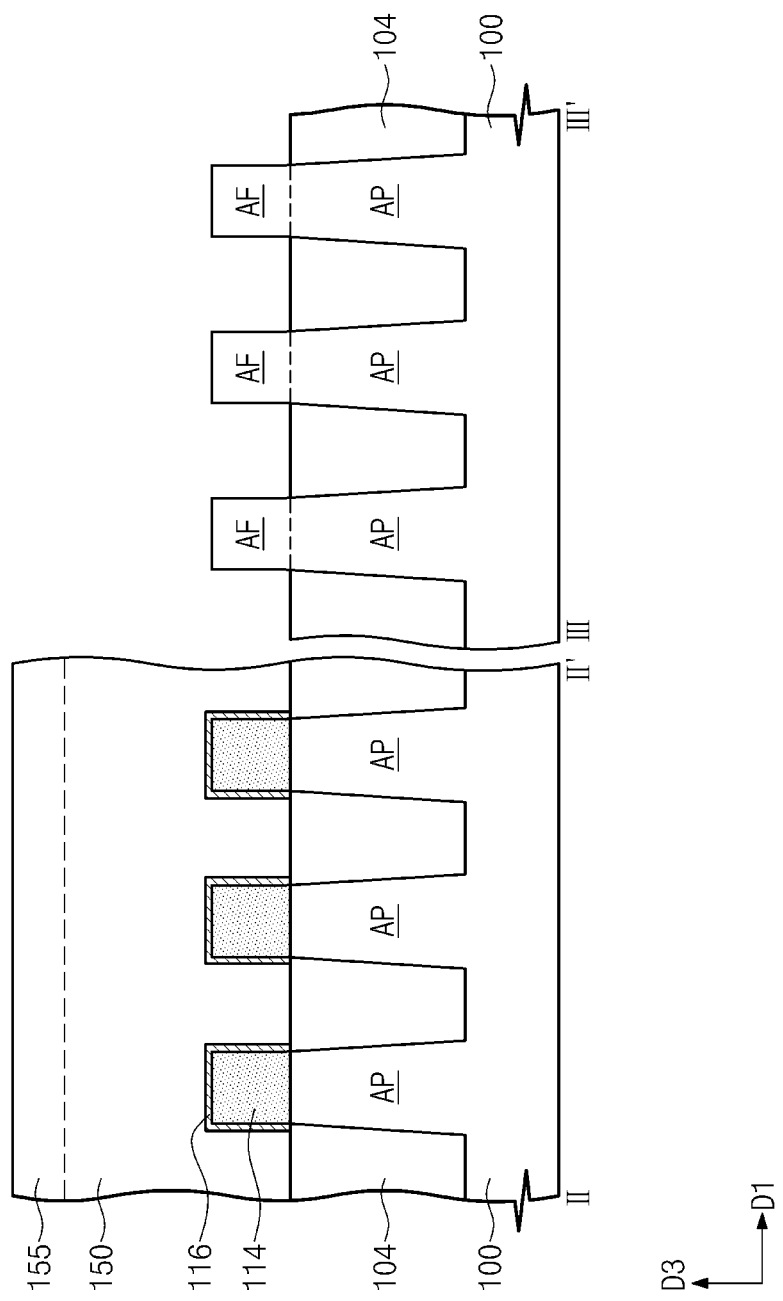

Referring to FIGS. 3A, 3B, and 3C, upper portions of the spacers 125 may be selectively etched, so upper portions of the insulating patterns 150 may protrude. The protruding upper portions of the insulating patterns 150 may be defined as protrusions 155. For example, the protrusion 150 may correspond to a portion of the insulating pattern 150 that is higher than a top surface of the etched spacer 125. When the spacers 125 are selectively etched, the upper portions of the insulating patterns 150 may be partially etched. Thus, a width of each of the protrusions 155 may become progressively less from its bottom toward its top (e.g., a tapered shape).

The sacrificial gate patterns 106 may be removed to form recess regions 130. The recess regions 130 may be formed by a process of selectively removing the sacrificial gate patterns 106. The recess regions 130 may expose the active fins AF and may extend in the first direction D1.

Figure 4A:
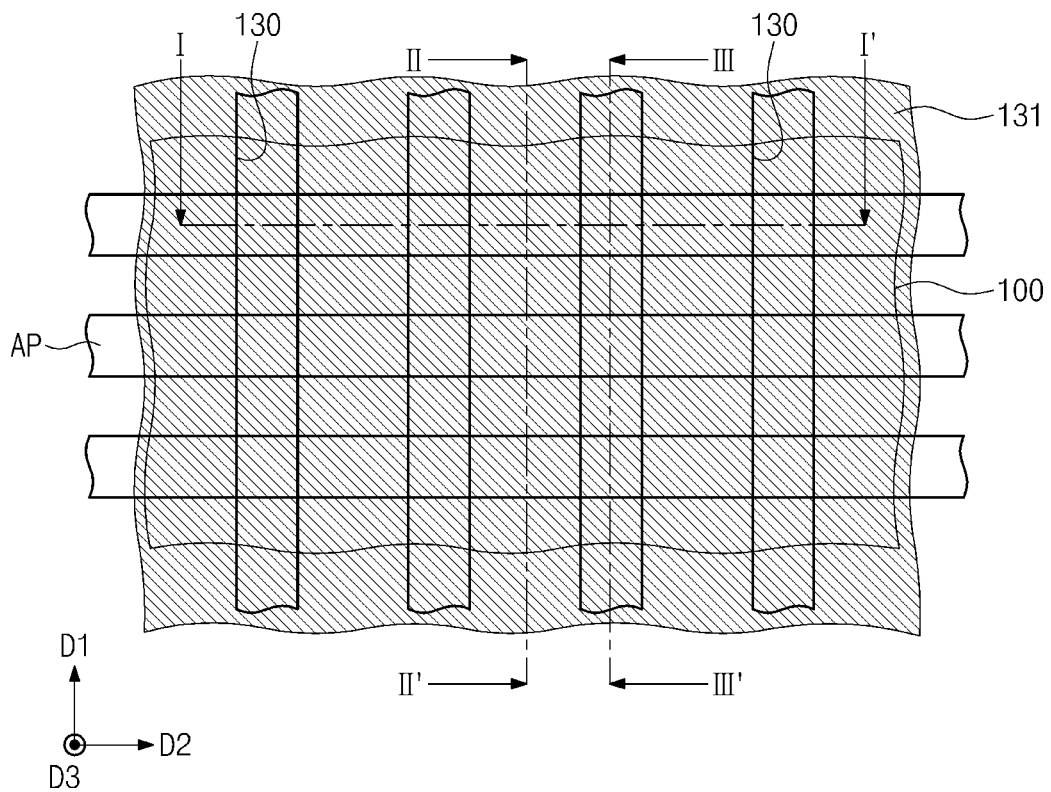
Figure 4B:
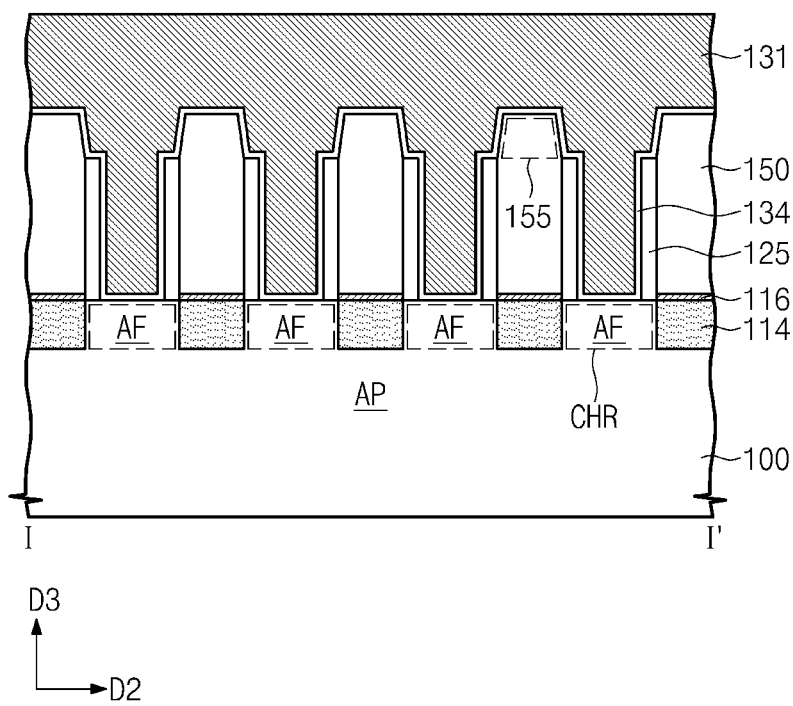
Figure 4C:
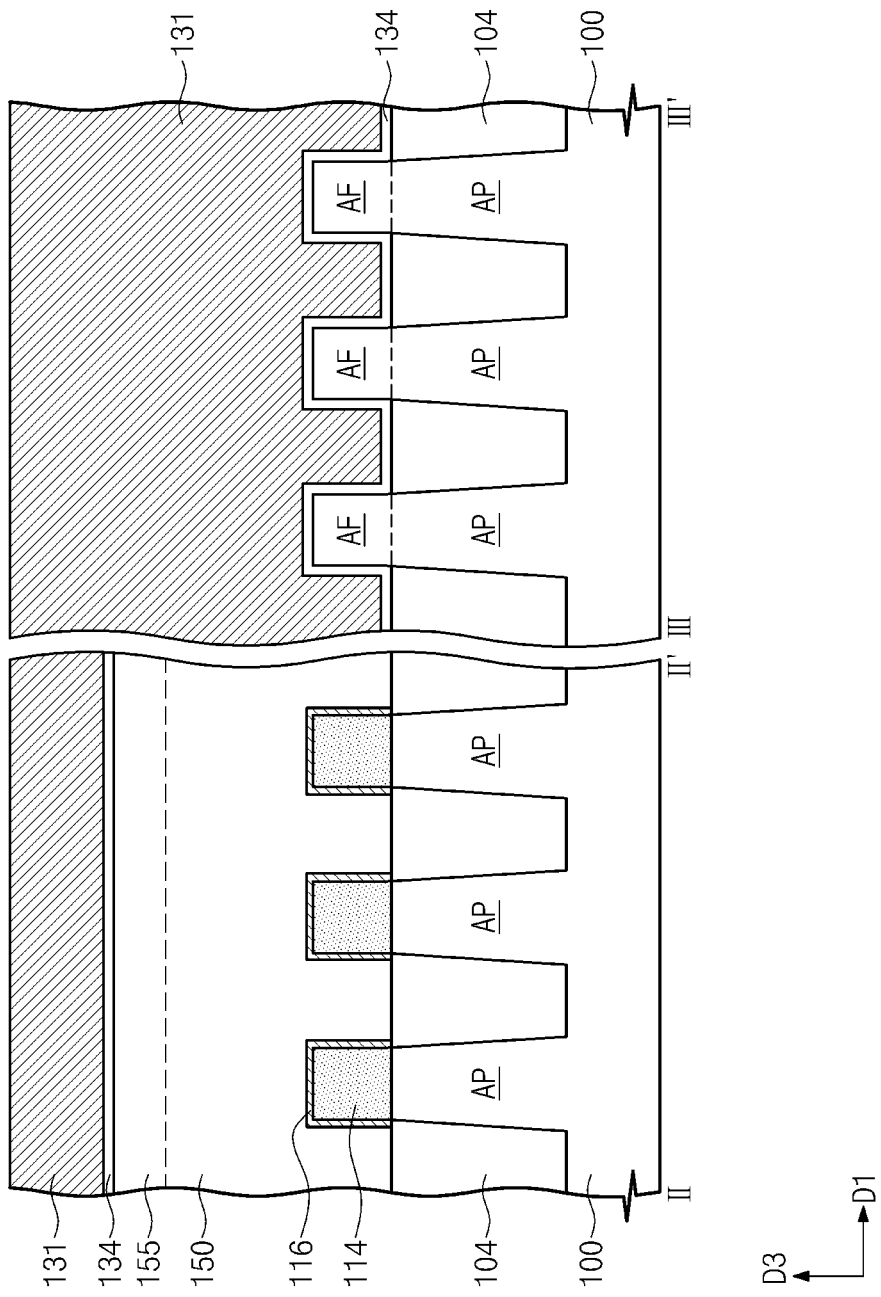

Referring to FIGS. 4A, 4B, and 4C, a gate dielectric layer 134 and a metal layer 131 may be formed in the recess regions 130. The gate dielectric layer 134 may be conformally formed to partially fill the recess regions 130. The gate dielectric layer 134 may cover bottom surfaces of the recess regions 130 and may extend onto sidewalls, exposed by the recess regions 130, of the spacers 125 and top surfaces of the insulating patterns 150. The gate dielectric layer 134 may be formed, for example, by an atomic layer deposition (ALD) process or a chemical oxidation process. In some embodiments, the gate dielectric layer 134 may include a high-k dielectric layer that includes at least one of, but not limited to, hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate. In other embodiments, the metal layer 131 may be replaced with non-metallic conductive layer, for example, such as poly-silicon, doped poly-silicon, silicon, or compound semiconductor material, etc.

Subsequently, the metal layer 131 filling the recess regions 130 may be formed on the gate dielectric layer 134. The metal layer 131 may be formed of a material having a high etch selectivity with respect to the insulating patterns 150. In some embodiments, the metal layer 131 may include at least one of a metal nitride (e.g., titanium nitride or tantalum nitride) or a metal material (e.g., titanium, tantalum, tungsten, copper, or aluminum). The metal layer 131 may be formed by a deposition process such as a chemical vapor deposition (CVD) process or a sputtering process.

Figure 5A:
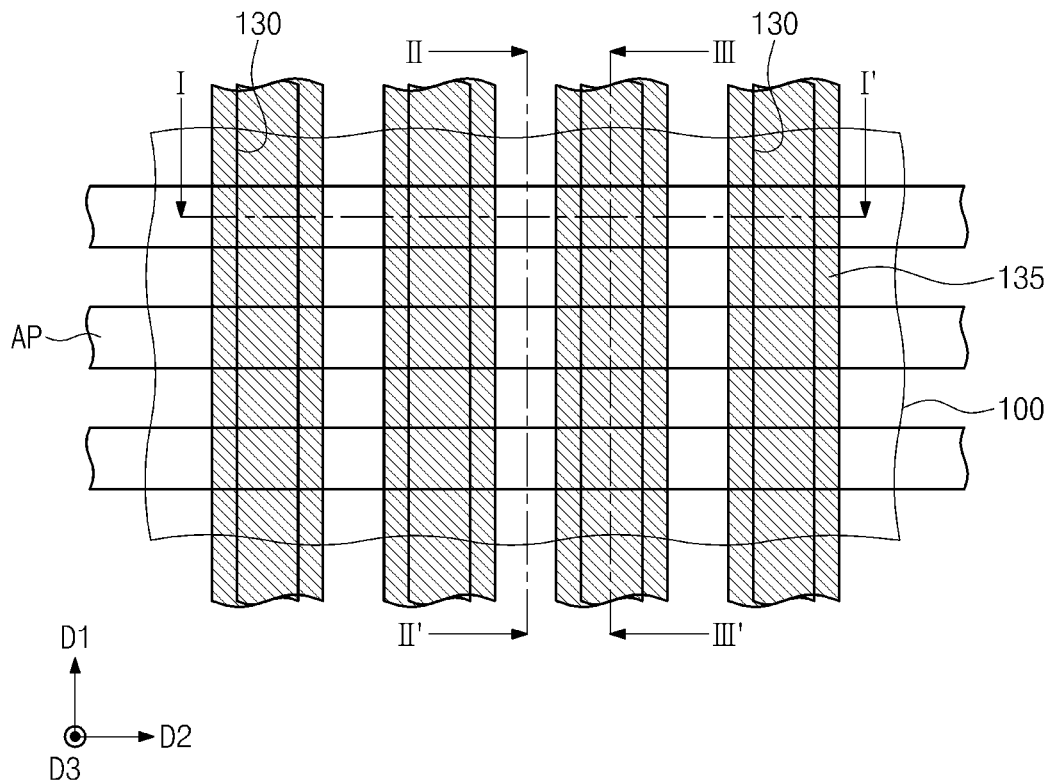
Figure 5B:
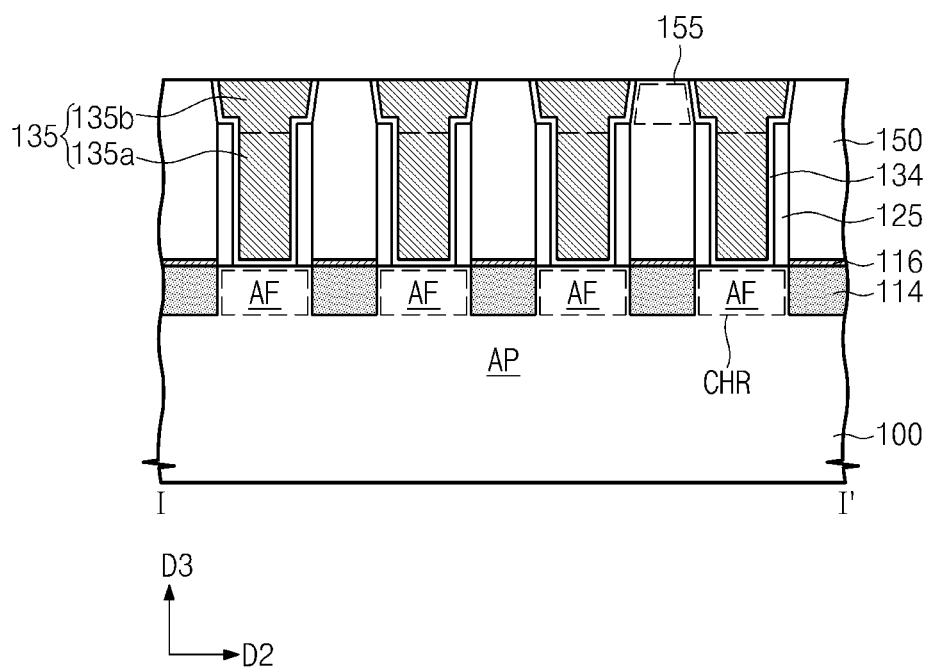

Referring to FIGS. 5A, 5B, and 5C, the metal layer 131 may be planarized to form conductive patterns 135 in the recess regions 130, respectively. Each of the conductive patterns 135 may include a gate portion 135a adjacent to the top surface of the substrate 100 and a metal hard mask portion 135b disposed on the gate portion 135a. The metal hard mask portion 135b may be vertically spaced apart from the top surface of the substrate 100 with the gate portion 135a interposed therebetween. In the present embodiment, the gate portion 135a and the metal hard mask portion 135b may constitute one united body. In more detail, the metal layer 131 and the gate dielectric layer 134 may be planarized until the top surfaces of the insulating patterns 150 are exposed. Thus, the gate dielectric layer 134 and the conductive pattern 135 may be confinedly formed in each of the recess regions 130. The gate dielectric layer 134 and the conductive patterns 135 in each of the recess regions 130 may extend in the first direction D1.

The process of planarizing the metal layer 131 and the gate dielectric layer 134 may include, for example, a CMP process. Due to the planarization process, the top surfaces of the insulating patterns 150 (i.e., top surfaces of the protrusions 155) may be coplanar with top surfaces of the conductive patterns 135 (i.e., top surfaces of the metal hard mask portions 135b).

The metal hard mask portion 135b may be adjacent to the protrusion 155 with the gate dielectric layer 134 interposed therebetween. A width of the protrusion 155 may become progressively less from a bottom toward a top thereof. Thus, the metal hard mask portion 135b may include a portion (e.g., the second portion 135b_2 of FIG. 1A) of which a width becomes progressively greater toward its top.

Figure 6A:
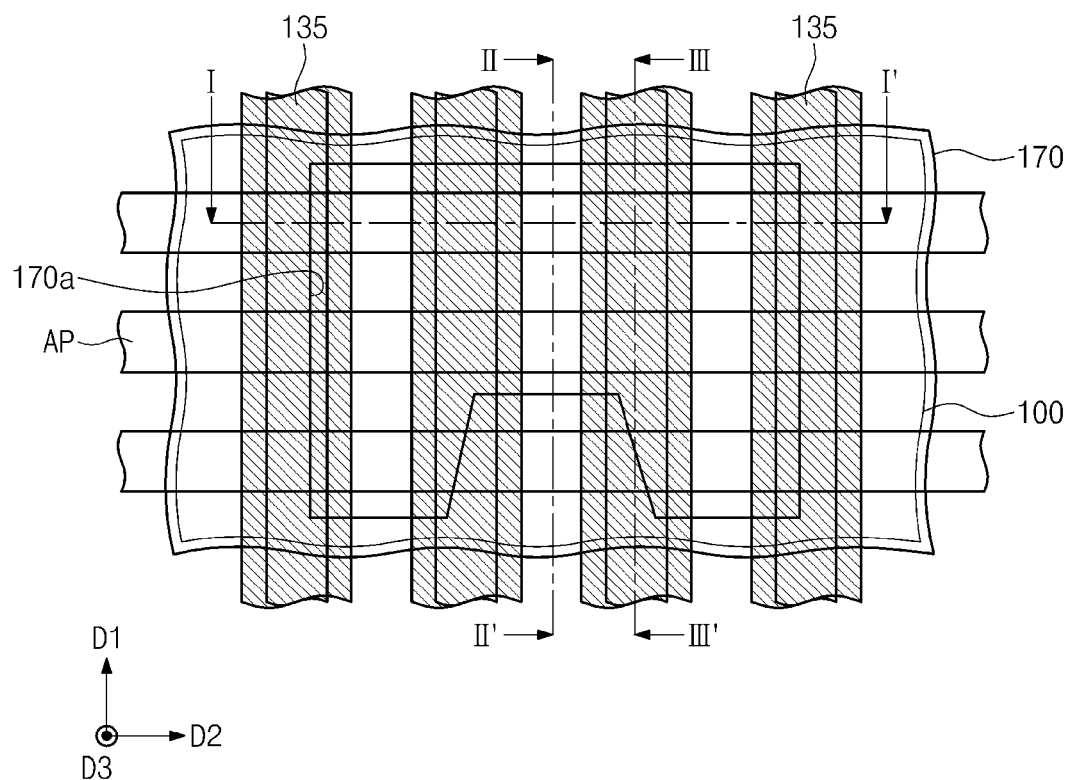
Figure 6B:
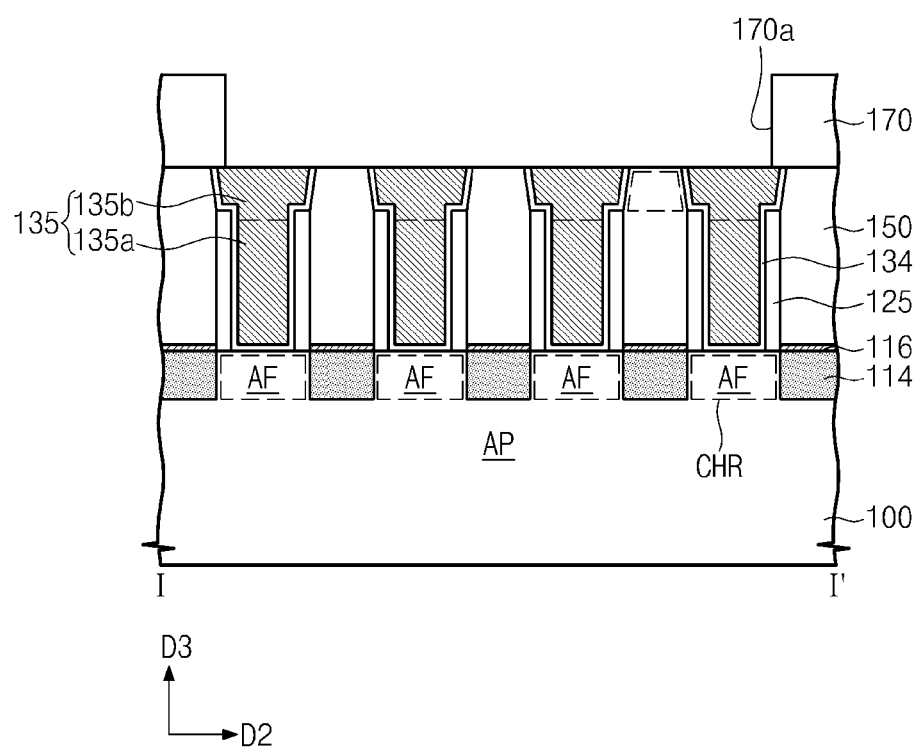

Referring to FIGS. 6A, 6B, and 6C, a photoresist mask 170 may be formed on the insulating patterns 150 and the conductive patterns 135. The photoresist mask 170 may include an opening 170a that expose portions of the metal hard mask portions 135b and portions of the insulating patterns 150. The opening 170a may be formed to overlap with contact holes 160 that will formed later. The opening 170a may have a closed-loop shape or a box shape.

Figure 7A:
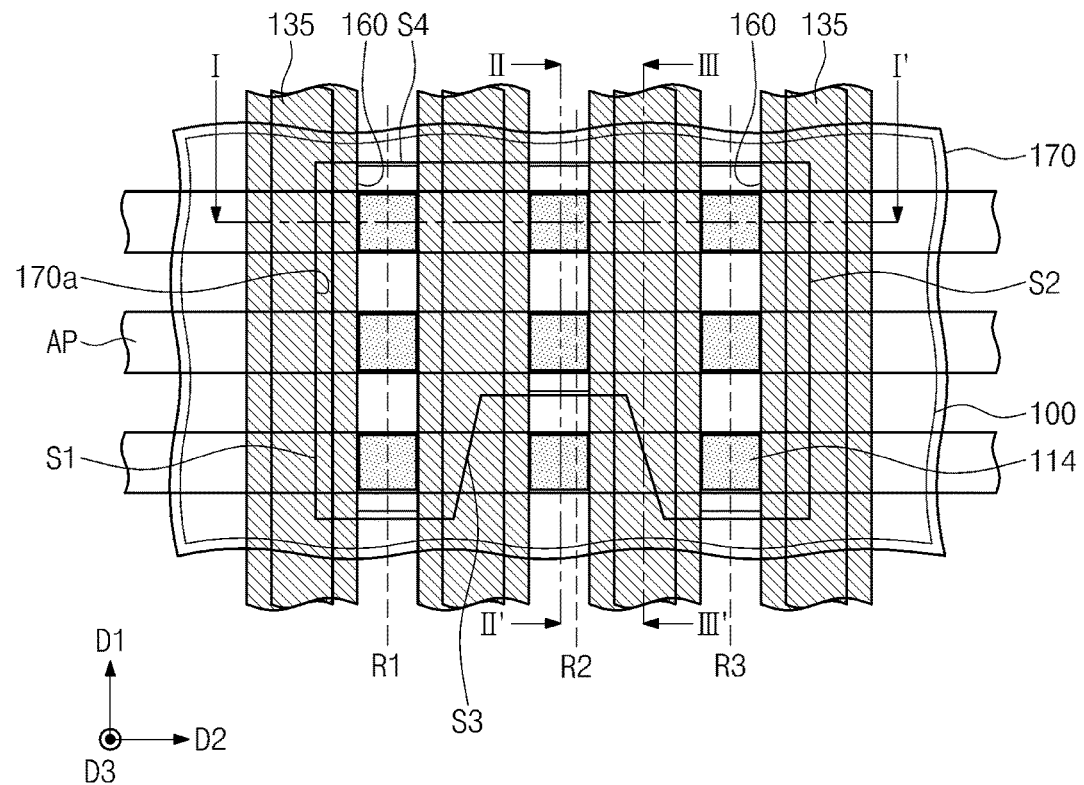
Figure 7B:
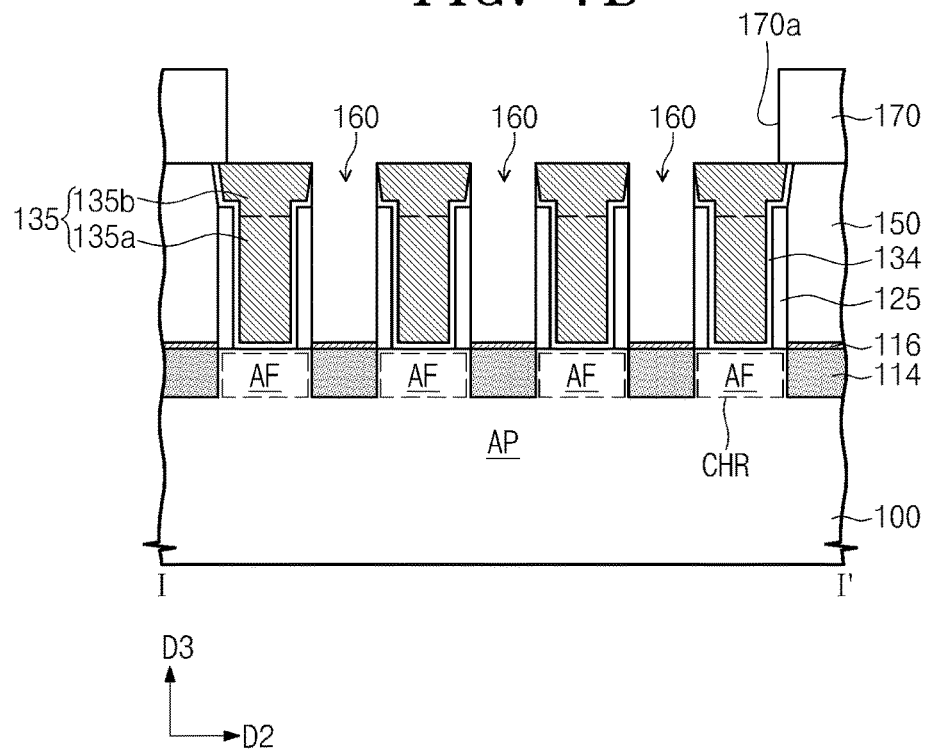
Figure 7C:
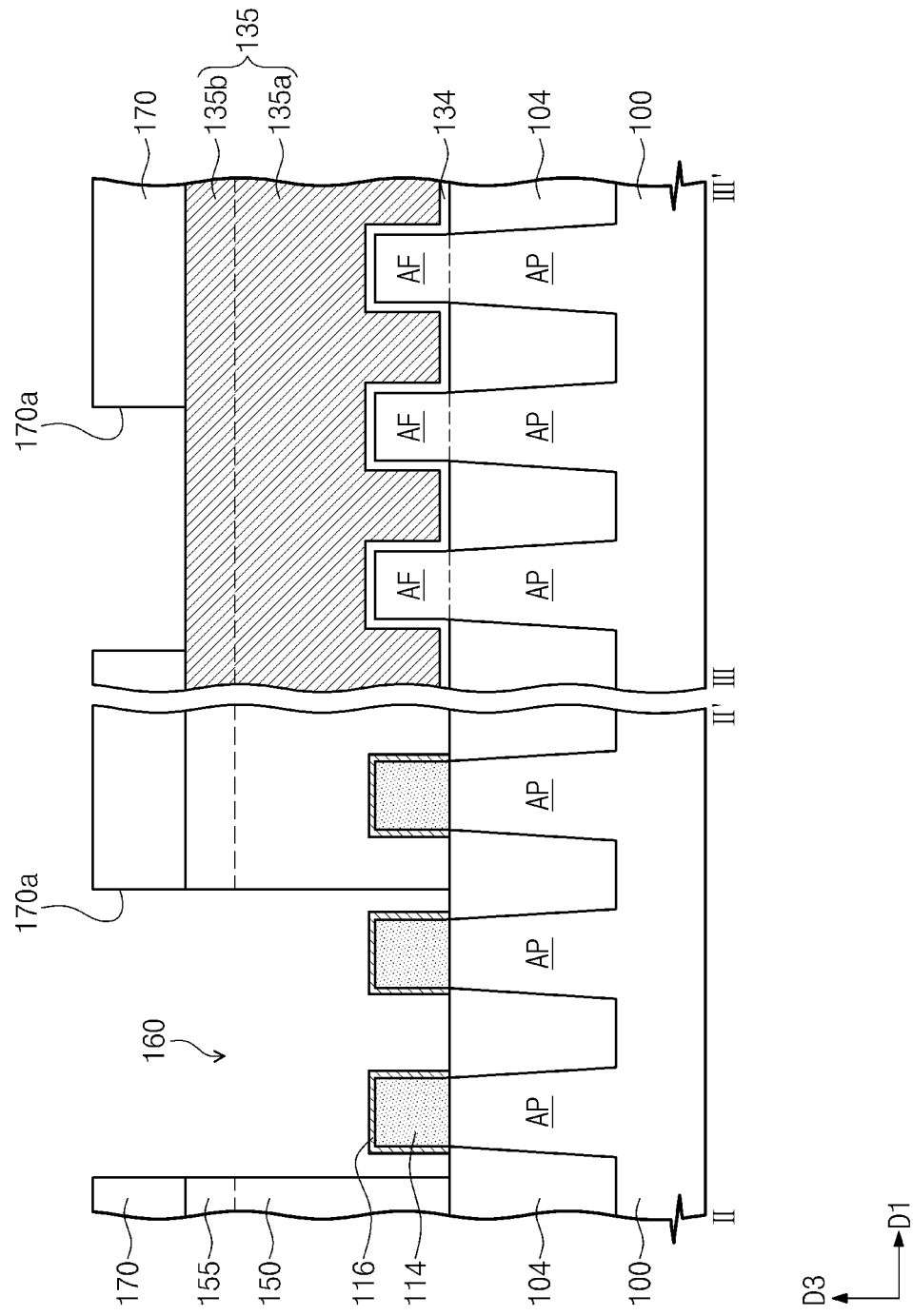

Referring to FIGS. 7A, 7B, and 7C, contact holes 160 may be formed to penetrate the insulating patterns 150. The contact holes may be vertically overlapped with the opening 170a. In more detail, the insulating patterns 150 may be anisotropically etched using the photoresist mask 170 as an etch mask. At this time, the metal hard mask portions 135b vertically overlapping with the opening 170a may also be used as the etch mask for etching the insulating patterns 150, as described with reference to FIG. 1C. The contact holes 160 may expose the semiconductor capping patterns 116 disposed on the epitaxial patterns 114 vertically overlapped with the opening 170a. In addition, the contact holes 160 may expose the device isolation patterns 104 disposed between the exposed epitaxial patterns 114.

In some embodiments, the epitaxial patterns 114 may constitute a first column R1, a second column R2, and a third column R3 which are parallel to the first direction D1. The first to third columns R1, R2, and R3 may be spaced apart from each other in the second direction D2 perpendicular to the first direction D1. The epitaxial patterns 114 may further constitute other columns as well as the first to third columns R1 to R3. However, the first to third columns R1 to R3 are illustrated as an example in the drawings for the purpose of convenience of illustration.

The contact holes 160 may overlap with the first to third columns R1 to R3. Each of the contact holes 160 may have a line or bar shape extending in the first direction. For example, one of the contact holes 160 may overlap with three epitaxial patterns 114 of the first column R1, another of the contact holes 160 may overlap with two epitaxial patterns 114 of the second column R2, and the other of the contact holes 160 may overlap with three epitaxial patterns 114 of the third column R3. Each of the contact holes 160 may have a length in the first direction D1. A length of the contact holes 160 overlapping with the second column R2 may be shorter than those of the contact holes 160 overlapping with the first and third columns R1 and R3.

Due to the metal hard mask portions 135b, the spacers 125 vertically overlapped with the opening 170a may remain after the etching process for the formation of the contact holes 170. Thus, the contact holes 160 may be laterally spaced apart from the gate portions 135a with the spacers 125 interposed therebetween. For example, each of the contact holes 160 may be a self-aligned contact hole which is self-aligned by the metal hard mask portions 135b. In addition, due to the metal hard mask portions 135b, a planar shape of the contact hole 160 may not correspond to that of the opening 170a. As a result, the metal hard mask portions 135b according to the present embodiment may improve a margin of the process for forming the photoresist mask 170 which is used to form the contact holes 160.

Figure 8A:
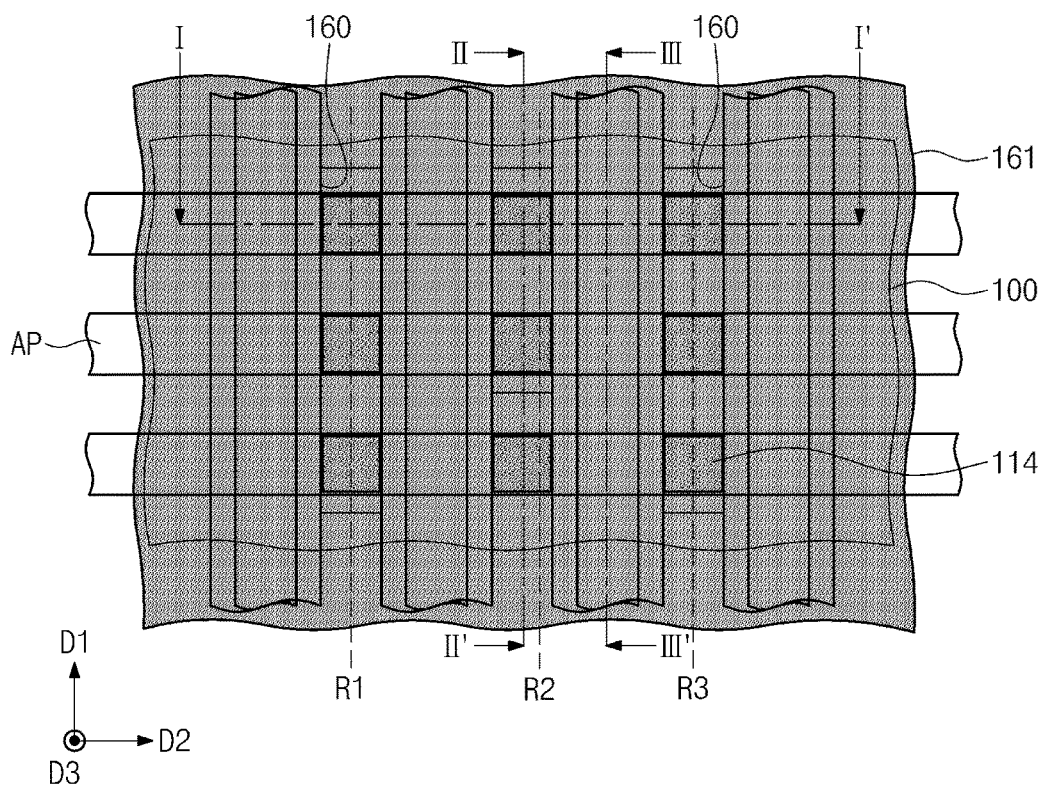
Figure 8B:
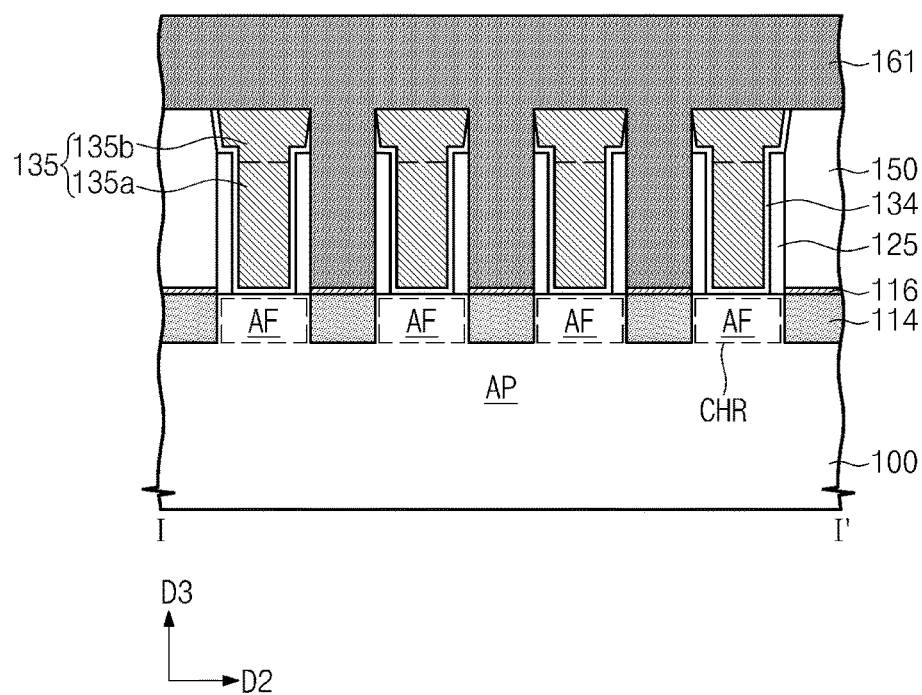
Figure 8C:
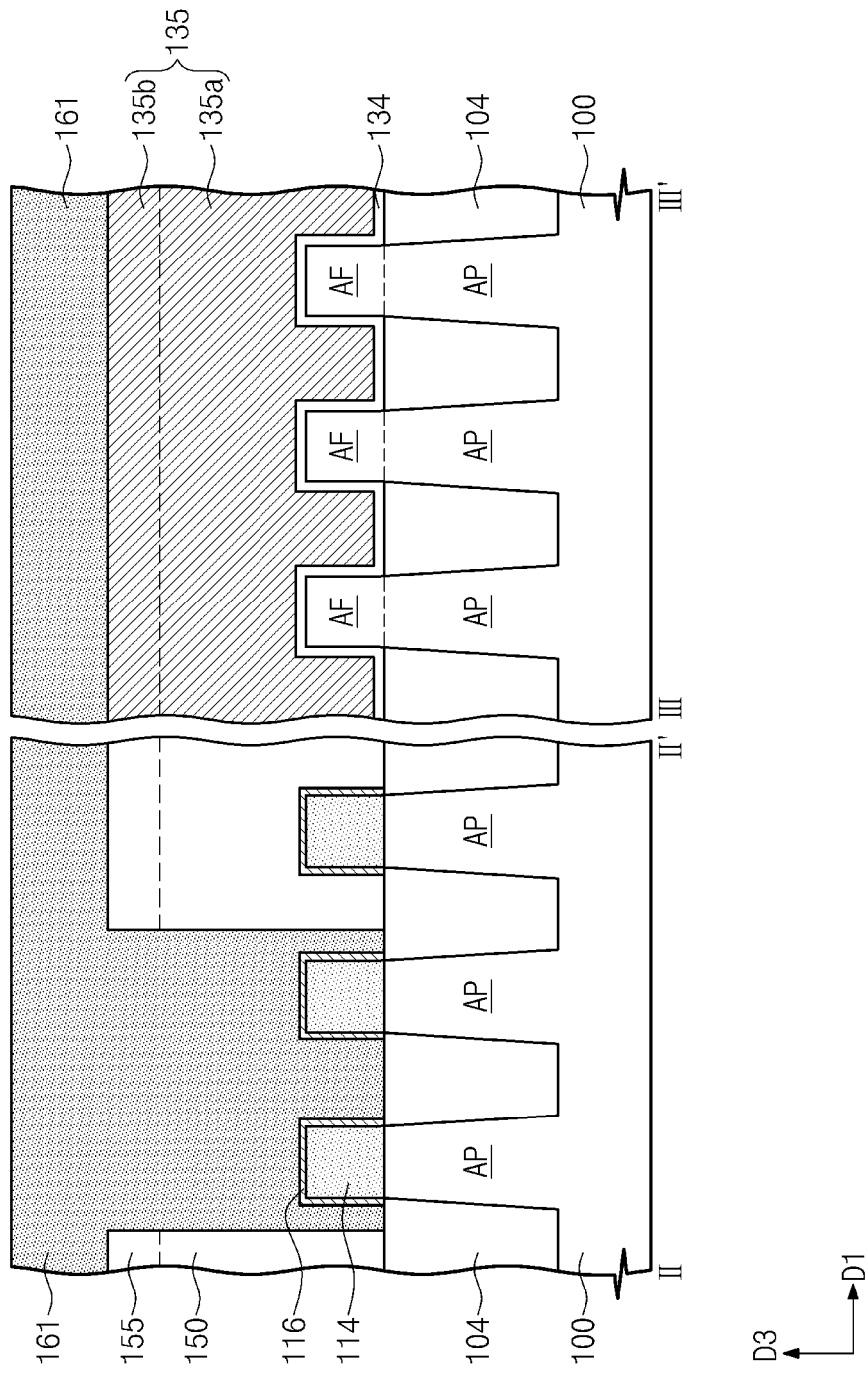

Referring to FIGS. 8A, 8B, and 8C, a conductive layer 161 may be formed to fill the contact holes 160. The photoresist mask 170 may be removed before the formation of the conductive layer 161, as described with reference to FIG. 1D.

Figure 9A:
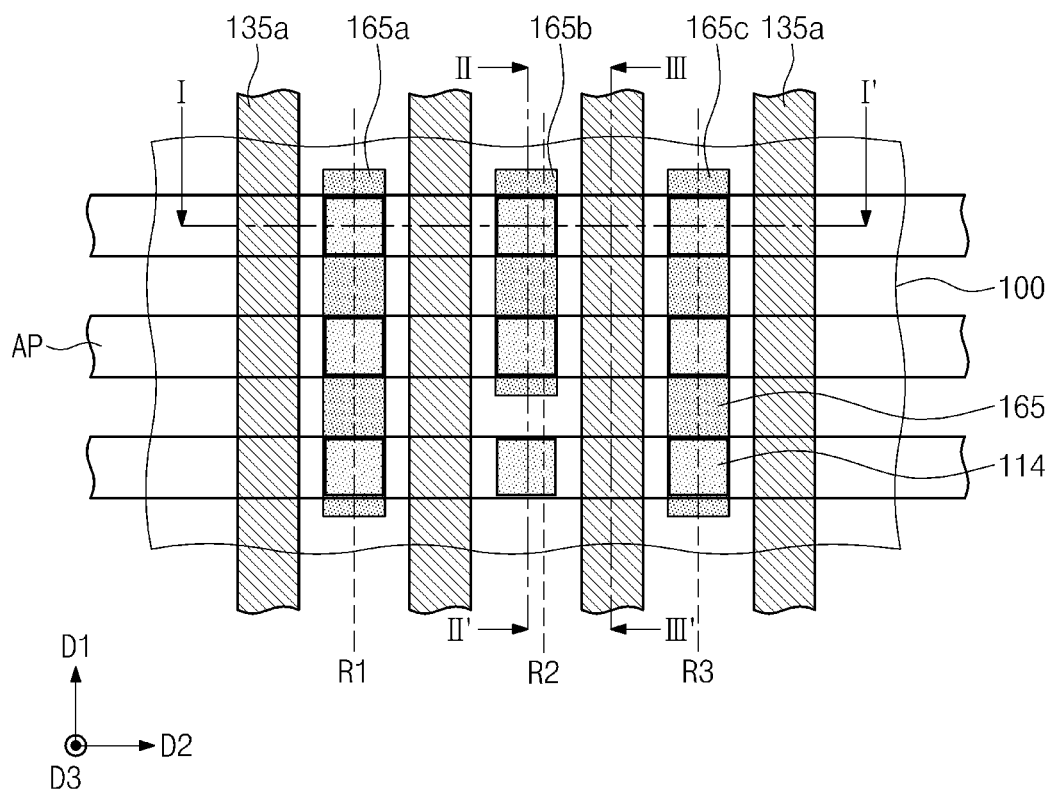
Figure 9B:
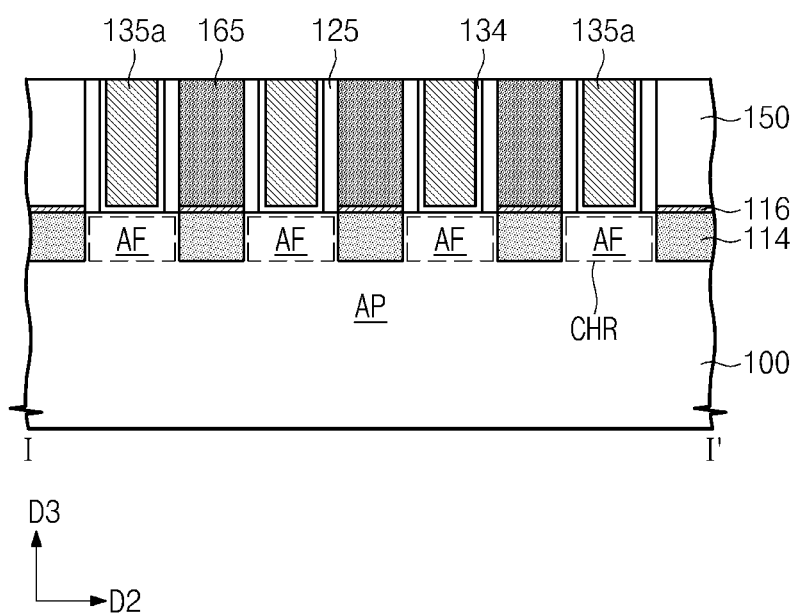

Referring to FIGS. 9A, 9B, and 9C, the conductive layer 161 and the conductive patterns 135 may be planarized to form contact plugs 165. At the same time, all the metal hard mask portions 135b may be removed. Thus, the gate portions 135a may remain on the substrate 100, as mentioned with reference to FIG. 1E. Planar shapes of the contact plugs 165 may correspond to those of the contact holes 160, respectively. The contact plugs 165 may include a first contact plug 165a connected to the three epitaxial patterns 114 of the first column R1, a second contact plug 165b connected to the two epitaxial patterns 114 of the second column R2, and a third contact plug 165c connected to the three epitaxial patterns 114 of the third column R3.

The conductive pattern 135 according to the present embodiment may be formed by one deposition process of depositing the metal layer. The conductive patterns 135 may act as the etch mask along the photoresist mask 170 during the process for the formation of the contact holes 160, and the remaining portions of the conductive patterns 135 after the planarization process may act as gate electrodes. Thus, efficiency of the processes for manufacturing a semiconductor device may be improved, and a high reliable semiconductor device may be realized.

Even though not shown in drawings, a second interlayer insulating layer (not shown) may be formed on an entire top surface of the substrate 100. Thereafter, connection contacts (not shown) respectively connected to the contact plugs 165 may be formed to penetrate the second interlayer insulating layer, and gate contacts (not shown) respectively connected to the gate portions 135a may be formed to penetrate the second interlayer insulating layer.

The semiconductor device according to the present embodiment will be described with reference to FIGS. 9A, 9B, and 9C hereinafter. The semiconductor device according to the present embodiment may include the gate portions 135a disposed on the substrate 100 and the contact plugs 165 disposed between the gate portions 135a.

The device isolation patterns 104 defining the active patterns AP may be disposed in the substrate 100. The device isolation patterns 104 may be arranged along the first direction D1 parallel to the top surface of the substrate and may have line shapes extending in the second direction D2 intersecting the first direction D1. Each of the active patterns AP may have a line shape which extends along the second direction D2 in parallel to the device isolation patterns 104.

The gate portions 135a may be disposed on the substrate 100 to intersect the active patterns AP. The active patterns AP may include active fins AF disposed under the gate portions 135a. The active fins AF may protrude from the active patterns AP in the third direction D3 perpendicular to the top surface of the substrate 100. The active fins AF may include channel regions disposed under the gate portions 135a. The gate portion 135a may be formed on a top surface and both sidewalls of the active fin AF. Each of the gate portions 135a may have the line shape which extends in the first direction D1 to intersect the active fins AF protruding in the third direction D3.

The epitaxial patterns 114 may be disposed on the active pattern AP at both sides of each of the gate portions 135a. The epitaxial patterns 114 may be source/drains which are epitaxially grown from the active pattern AP. Top surfaces of the active fins AF may be higher than bottom surfaces of the epitaxial patterns 114. Top surfaces of the epitaxial patterns 114 may be disposed at the same level as the top surfaces of the active fins AF or may be higher than the top surfaces of the active fins AF. Each of the active fins AF may be disposed between the epitaxial patterns 114 adjacent to each other.

The semiconductor capping patterns 116 may be disposed on the epitaxial patterns 114, respectively. The semiconductor capping patterns 116 may be in contact with the epitaxial patterns 114, respectively. Even though not shown in the drawings, a metal silicide may be disposed on each of the semiconductor capping patterns 116.

The spacers 125 may be disposed on both sidewalls of each of the gate portions 135a. The spacers 125 may extend along the gate portions 135a in the first direction D1.

The gate dielectric layer 134 may be disposed between the gate portion 135a and the active fin AF and between the gate portion 135a and the spacers 125 adjacent to the gate portion 135a. The gate dielectric layer 134 may extend along a bottom surface of the gate portion 135a. Thus, the gate dielectric layer 134 may cover the top surface and both sidewalls of the active fin AF. In addition, the gate dielectric layer 134 may horizontally extend from the active fin AF to partially cover top surfaces of the device isolation patterns 104. In some embodiments, the top surfaces of the device isolation patterns 104 may include portions that are not covered with the gate dielectric layer 134. The portions, which are not covered with the gate dielectric layer 134, of the device isolation patterns 104 may be covered with the insulating patterns 150.

The insulating patterns 150 may be disposed on the substrate 100. The insulating patterns 150 may cover a first sidewall of each of the spacers 125 and the semiconductor capping patterns 116. The top surfaces of the insulating patterns 150 may be substantially coplanar with the top surfaces of the gate portions 135a and the top surfaces of the spacers 125.

The contact plugs 165 may penetrate the insulating patterns 150 so as to be connected to the semiconductor capping patterns 116. The contact plugs 165 may be electrically connected to the epitaxial patterns 114 through the semiconductor capping patterns 116. The contact plugs 165 may be spaced apart from the gate portions 135a with the spacers 125 interposed therebetween. Each of the contact plugs 165 may have a line or bar shape extending in the first direction D1. Each of the contact plugs 165 may overlap with at least two epitaxial patterns 114 which are arranged in the first direction D1.

Figure 10:
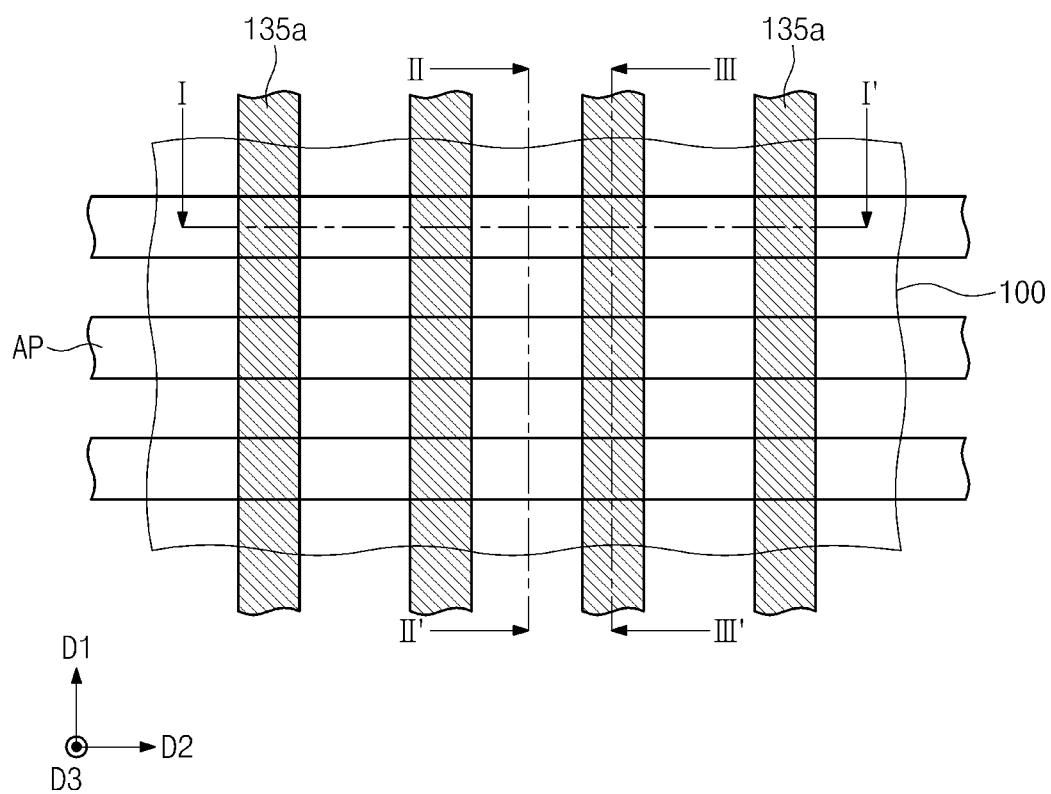
FIG. 10 is a plan view illustrating a method for manufacturing a semiconductor device according to still other example embodiments of the inventive concepts.

FIG. 10 is a plan view illustrating a method for manufacturing a semiconductor device according to still other example embodiments of the inventive concepts. FIGS. 11A to 18A are cross-sectional views corresponding to lines I-I' of FIGS. 10 and 4A to 9A to illustrate a method for manufacturing a semiconductor device according to still other example embodiments of the inventive concepts. FIGS. 11B to 18B are cross-sectional views corresponding to lines II-II' and III-III' of FIGS. 10 and 4A to 9A to illustrate a method for manufacturing a semiconductor device according to still other example embodiments of the inventive concepts. In the present embodiment, the same technical features as described with reference to FIGS. 1A to 1E, 2A to 9A, 2B to 9B, and 2C to 9C will be omitted or mentioned briefly for the purpose of ease and convenience in explanation. In other words, differences between the present embodiment and the above embodiments will be mainly described. Hereinafter, the same elements as mentioned in the above embodiments will be indicated by the same reference numerals or the same reference designators.

Figure 11A:
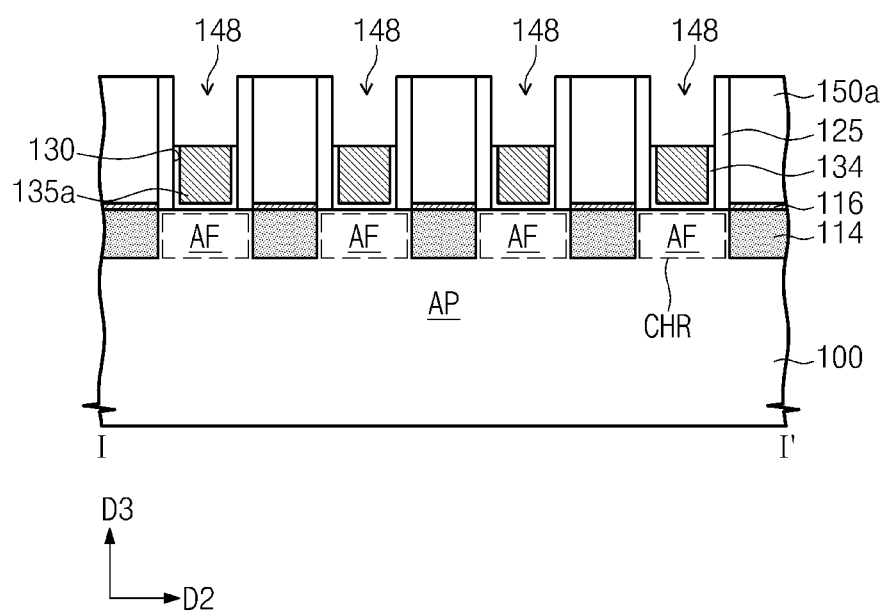
Figure 11B:
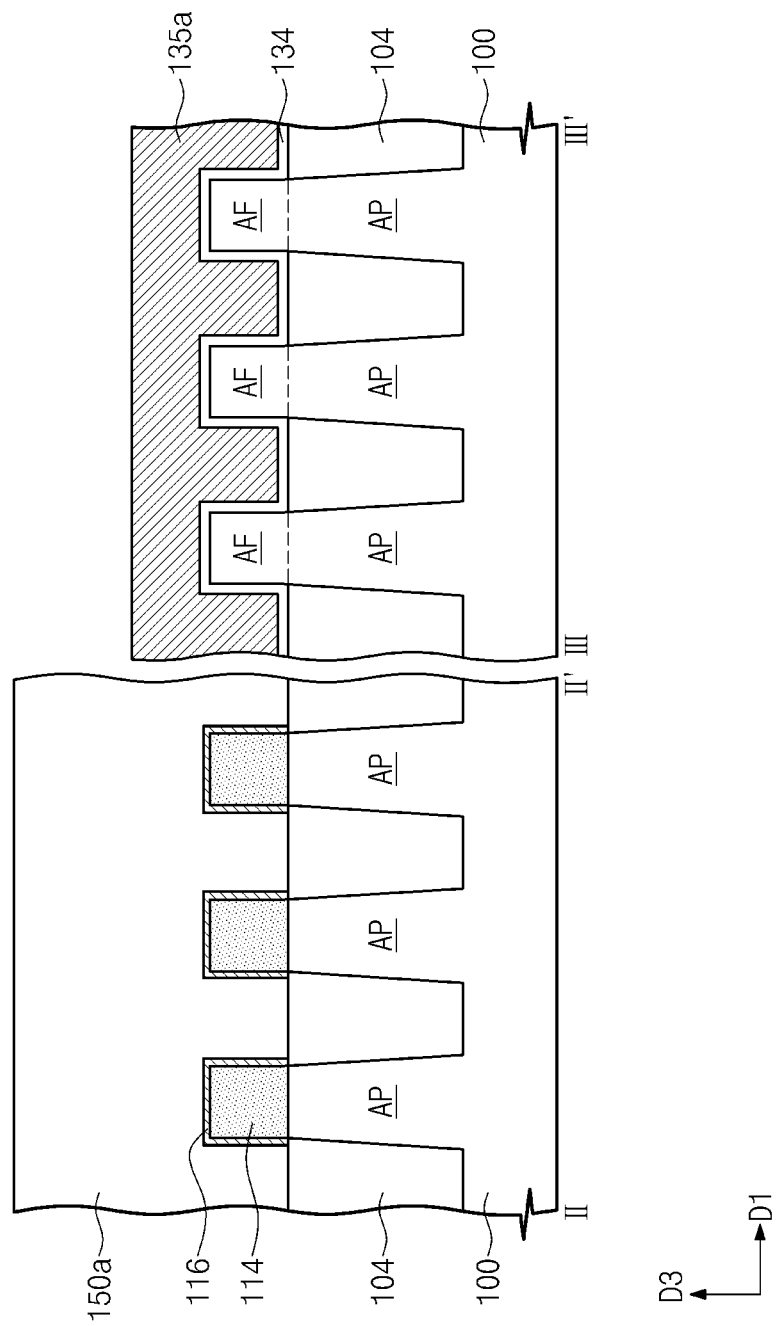

Referring to FIGS. 10, 11A, and 11B, the sacrificial gate patterns 106 may be replaced by gate portions 135a in the resultant structure of FIGS. 2A, 2B, and 2C. In more detail, the sacrificial gate patterns 106 may be removed to form first recess regions 130. The first recess regions 130 may be formed by a process of selectively removing the sacrificial gate patterns 106. The first recess regions 130 may expose the active fins AF and may extend in the first direction D1. Upper portions of the spacers 125 may not be selectively etched. Thus, top surfaces of the spacers 125 may be substantially coplanar with top surfaces of interlayer insulating patterns 150a.

A gate dielectric layer 134 and a first conductive layer may be formed in the first recess regions 130 (See FIGS. 5A and 5B). The first conductive layer may include a non-metallic conductive material (e.g., doped poly-silicon or poly-silicon) or at least one of a conductive metal nitride and a metal material. Subsequently, the first conductive layer and the gate dielectric layer 134 may be planarized until the top surfaces of the interlayer insulating patterns 150a are exposed (See FIGS. 6A and 6B). Thus, the gate dielectric layer 134 and a preliminary gate portion may be confinedly formed in each of the first recess regions 130. The gate dielectric layer 134 and the preliminary gate portions may extend in the first direction D1.

Upper portions of the preliminary gate portions may be recessed to form the gate portions 135a and second recess regions 148. In more detail, the gate portions 135a may be formed by an etching process for selectively removing the preliminary gate portions. The top surfaces of the gate portions 135a may be lower than the top surfaces of the interlayer insulating patterns 150a by the etching process. In some embodiments, portions of the gate dielectric layer 134 which are higher than the top surfaces of the gate portions 135a may be removed after the formation of the gate portions 135a. Thus, the gate dielectric layer 134 may be disposed between the substrate 100 and the gate portion 135a and between the gate portion 135a and the spacers 125. The second recess regions 148 may expose the top surfaces of the gate portions 135a, inner sidewalls of the spacers 125, and top surfaces of the gate dielectric layers 134.

Figure 12A:
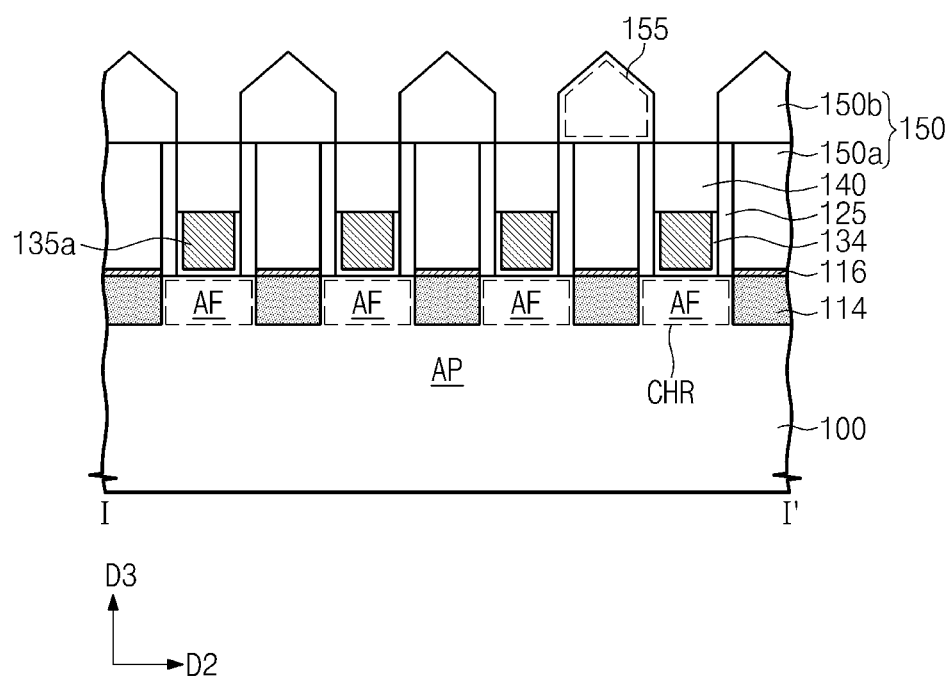

Referring to FIGS. 10, 12A, and 12B, a capping layer may be deposited on an entire top surface of the substrate 100 to form first capping patterns 140 and second capping patterns 150b. The first capping patterns 140 may cover the top surfaces of the gate portions 135a, respectively. Each of the second capping patterns 150b may cover the top surface of each of the interlayer insulating patterns 150a and the top surfaces of the spacers 125 adjacent to each of the interlayer insulating patterns 150a.

The capping layer may be formed of a material having an etch selectivity with respect to the interlayer insulating patterns 150a. For example, the capping layer may include at least one of, for example, SiON, SiCN, SiCON, or SiN. The capping layer may be formed by a deposition process having a good gap-fill characteristic, for example, a chemical vapor deposition (CVD) process. For example, the deposition process may be a plasma-enhanced CVD (PECVD) process or a high-density plasma CVD (HDP-CVD) process. In addition, the deposition process may also use an etching gas for improving the gap-fill characteristic. Since the capping layer is formed using the deposition process having the excellent gap-fill characteristic, the first capping patterns 140 may be spaced apart from the second capping patterns 150b. A width of the second capping pattern 150b may become progressively less toward a top of the second capping pattern 150b.

The interlayer insulating pattern 150a and the second capping pattern 150b which are sequentially stacked may be defined as an insulating pattern 150 according to embodiments of the inventive concepts. The second capping patterns 150b may correspond to the protrusions 155 of the insulating patterns 150 described with reference to FIGS. 3A, 3B, and 3C.

Figure 13A:
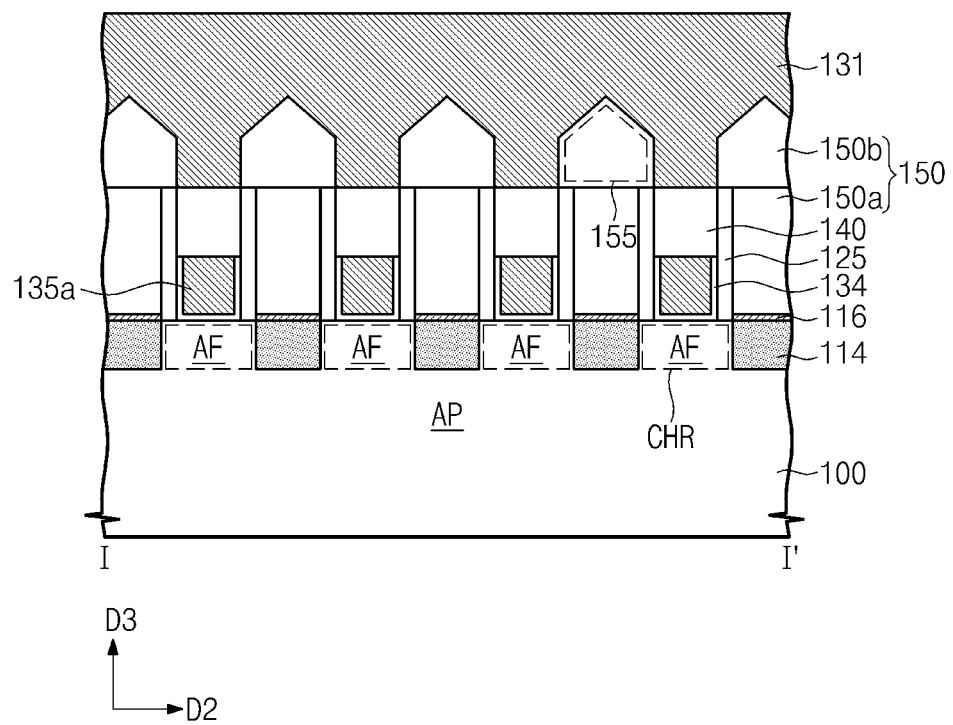
Figure 13B:
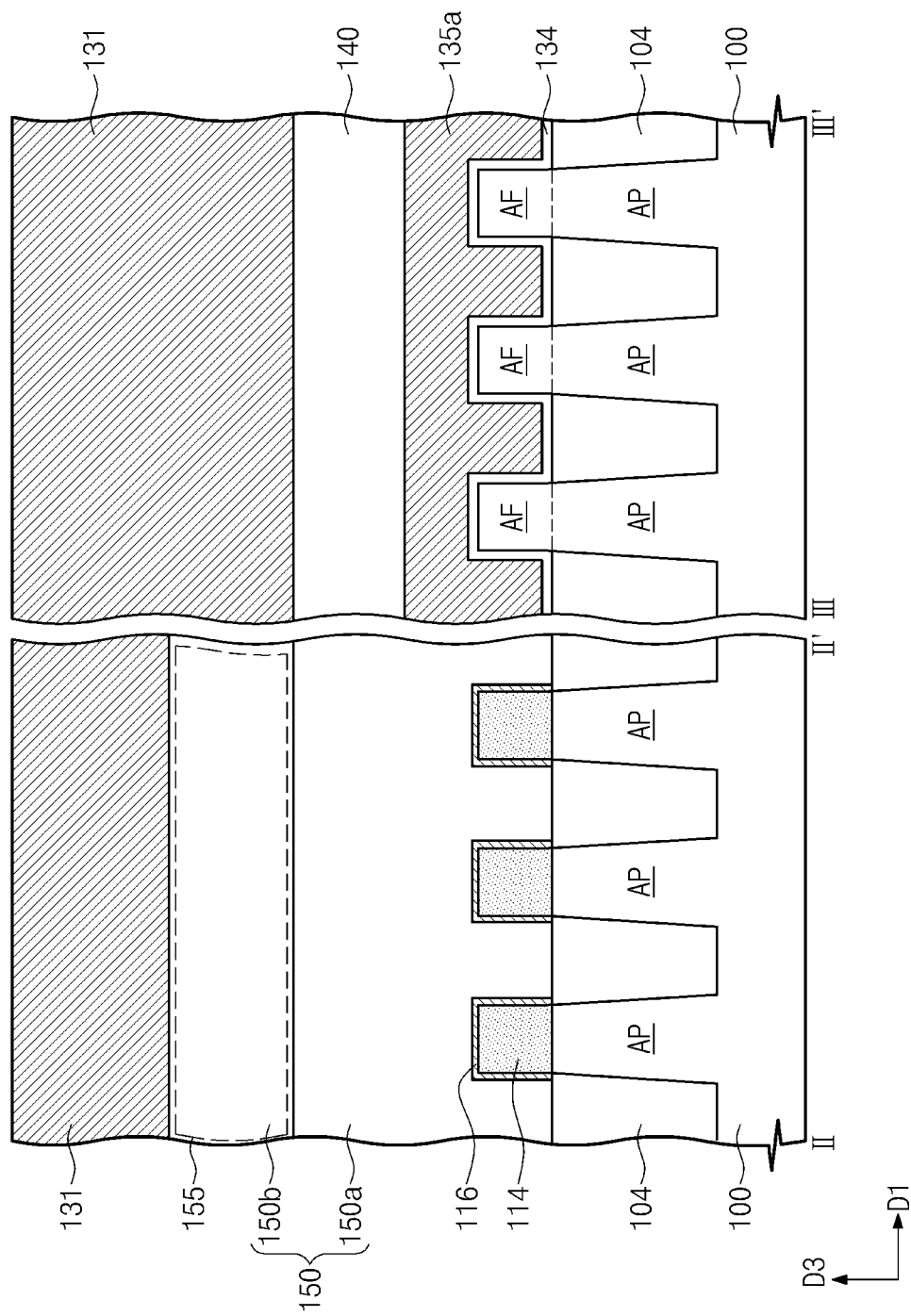

Referring to FIGS. 4A, 13A, and 13B, a metal layer 131 may be formed to cover the first and second capping patterns 150b. The metal layer 131 may be formed of a material having a high etch selectivity with respect to the insulating patterns 150. For example, the metal layer 131 may include at least one of a metal nitride (e.g., titanium nitride or tantalum nitride) or a metal material (e.g., titanium, tantalum, tungsten, copper, or aluminum). In other embodiments, non-metallic conductive material (e.g., poly-silicon, doped poly-silicon, silicon, or compound semiconductor material, etc.) may be used instead of the metal layer 131. The metal layer 131 may be formed by a deposition process such as a CVD process or a sputtering process.

Figure 14A:
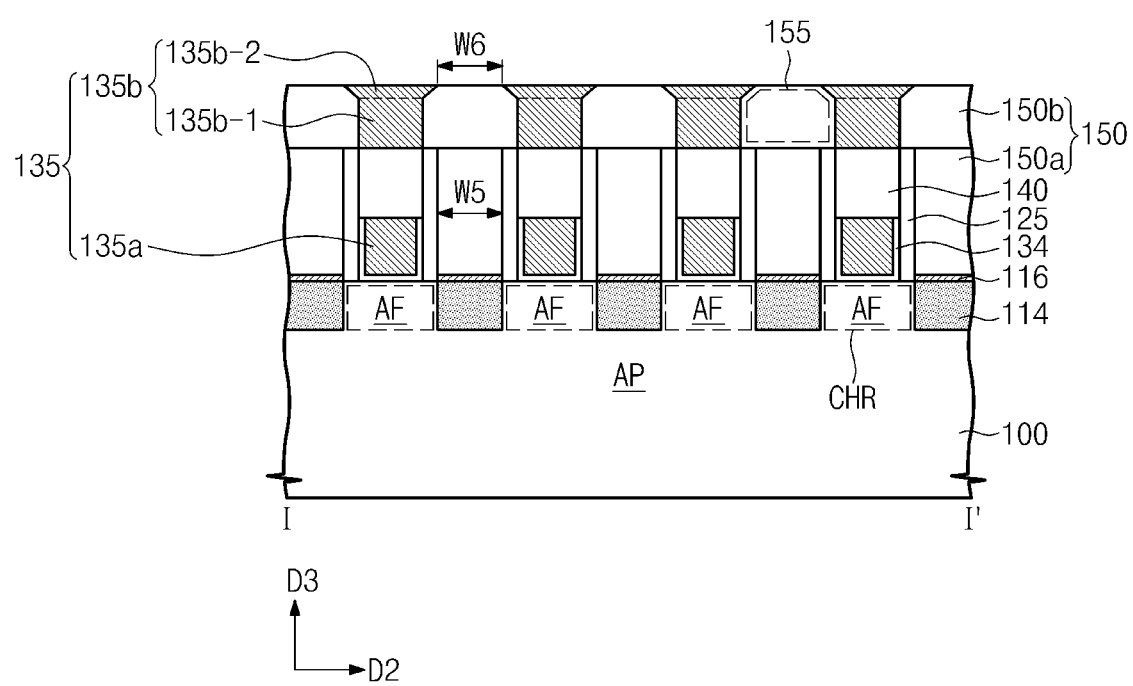
Figure 14B:
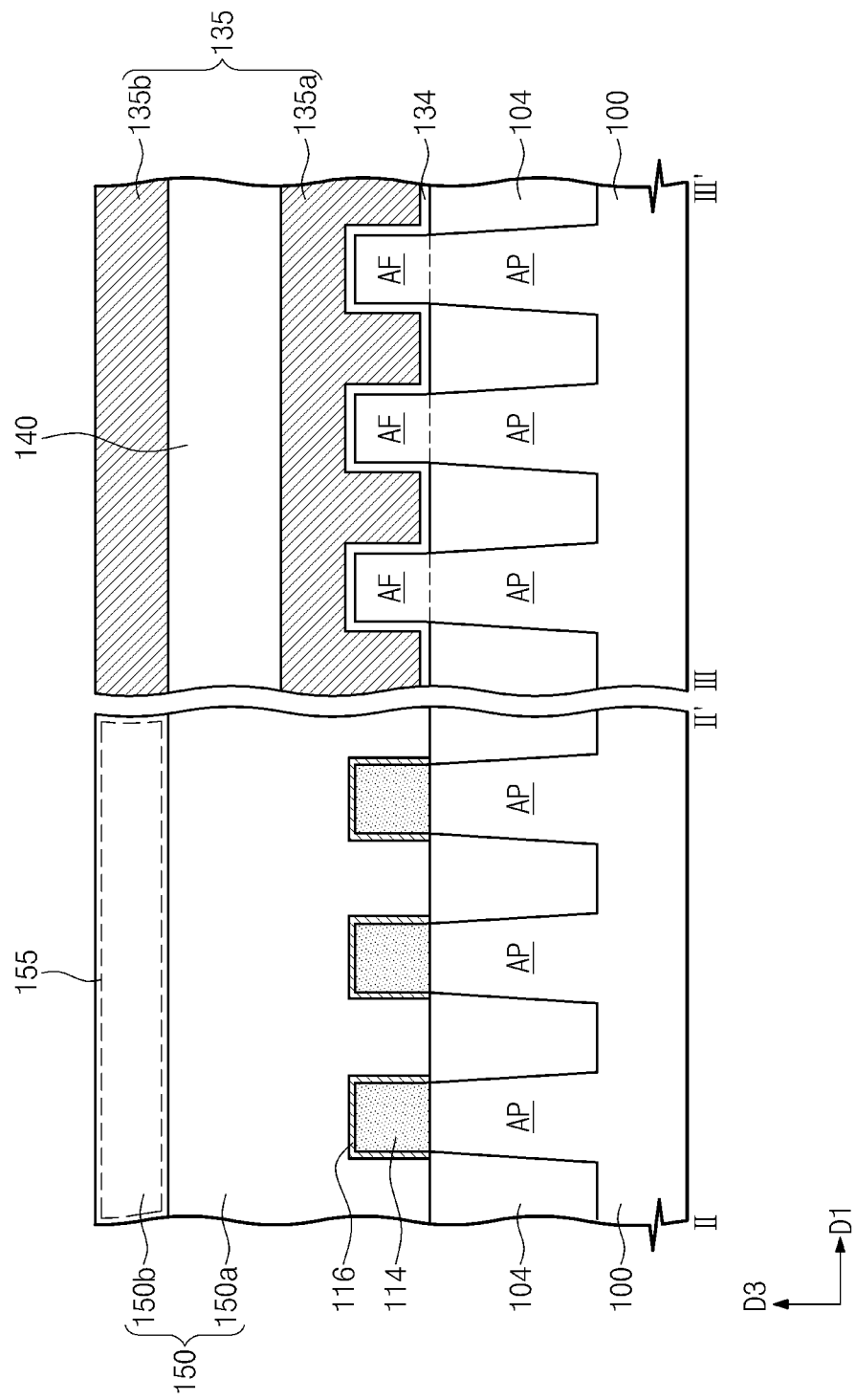

Referring to FIGS. 5A, 14A, and 14B, the metal layer 131 may be planarized to form metal hard mask portions 135b. In more detail, the metal layer 131 may be planarized until the second capping patterns 150b are exposed. At this time, upper portions of the second capping patterns 150b may be partially removed, top surfaces of the second capping patterns 150b may be lowered. The planarization process may be performed until a width W6 of the top surface of the second capping pattern 150b becomes substantially equal to a width W5 of the interlayer insulating pattern 150a. In other embodiments, the planarization process may be performed, so the width W6 of the top surface of the second capping pattern 150b may be smaller than the width W5 of the interlayer insulating pattern 150a.

For example, the top surfaces of the second capping patterns 150b may be exposed by the metal hard mask portions 135b. The top surfaces of the metal hard mask portions 135b may vertically overlap with the top surfaces of the spacers 125. The width W6 of the top surface of the second capping pattern 150b exposed by the metal hard mask portions 135b may be substantially equal to or smaller than the width W5 of the top surface of the interlayer insulating pattern 150a.

Each of the metal hard mask portions 135b may be vertically spaced apart from the gate portion 135a with the first capping pattern 140 interposed therebetween. The gate portion 135a and the metal hard mask portion 135b may be defined as the conductive pattern 135 of the inventive concepts. However, unlike FIGS. 6A and 6B, the gate portion 135a and the metal hard mask portion 135b may be formed independently of each other. For example, the gate portion 135a and the metal hard mask portion 135b may not constitute one united body. Thus, gate portion 135a and the metal hard mask portion 135b may be formed of conductive materials different from each other.

In some embodiments, each of the conductive patterns 135 may include a first portion corresponding to the gate portion 135a, and second and third portions 135b_1 and 135b_2 corresponding to the metal hard mask portion 135b. Each of the first and second portions of the conductive patterns 135 may have a rectangular, and the third portion 135b_2 may have a tapered shape, when viewed from a cross-section view. A bottom of the third portion 135b_2 may be the same height as a top of the second portion 135b_1.

Figure 15A:
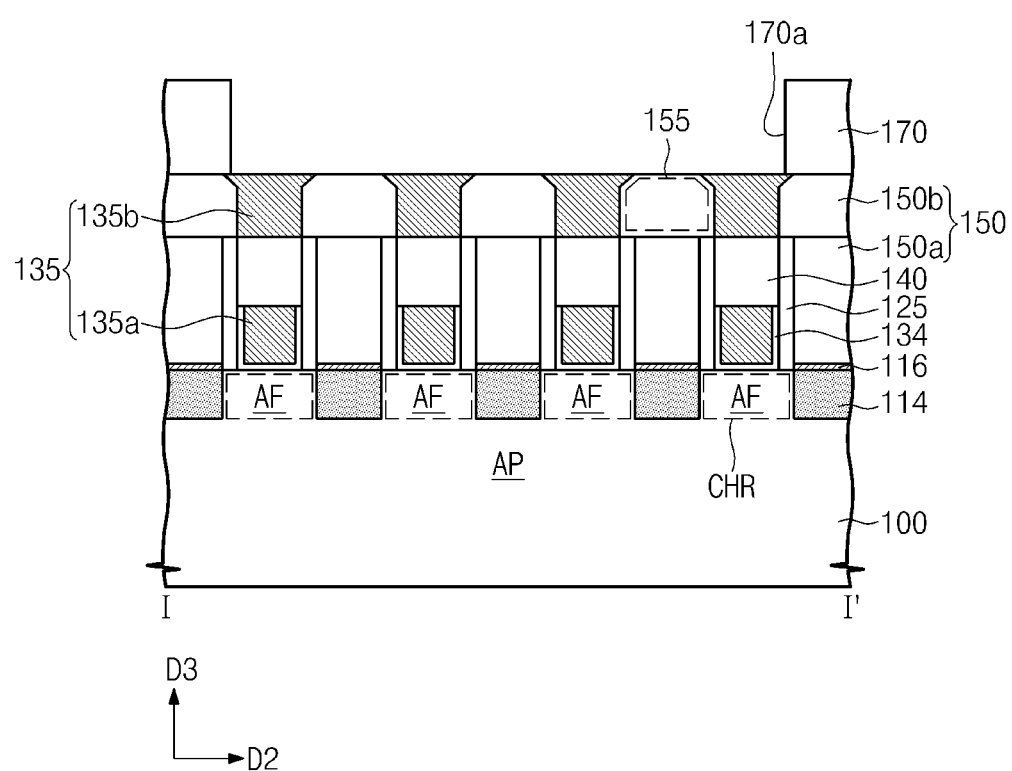

Referring to FIGS. 6A, 15A, and 15B, a photoresist mask 170 may be formed on the insulating patterns 150 and the conductive patterns 135. The photoresist mask 170 may include an opening 170a that expose portions of the metal hard mask portions 135b and portions of the second capping patterns 150b. The method of forming the photoresist mask 170 may be the same as the method of forming the photoresist mask 170 described with reference to FIGS. 6A, 6B, and 6C.

Figure 16A:
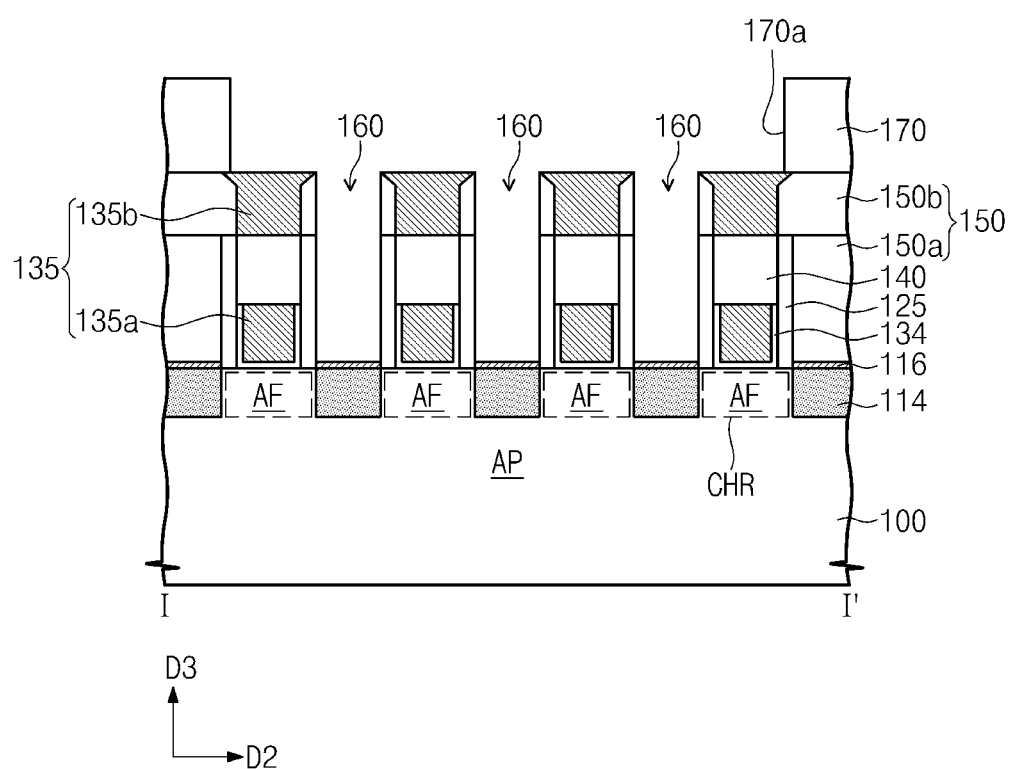

Referring to FIGS. 7A, 16A, and 16B, contact holes 160 may be formed to penetrate the insulating patterns 150. The contact holes may be vertically overlapped with the opening 170a. The spacers 125 vertically overlapped with the opening 170a may remain by the metal hard mask portions 135b after an etching process for the formation of the contact holes 160. Thus, the contact holes 160 may be laterally spaced apart from the gate portions 135a with the spacers 125 interposed therebetween. The method of forming the contact holes 160 may be the same as the method of forming the contact holes 160 described with reference to FIGS. 2B, 8A, 8B, and 8C.

Figure 17A:
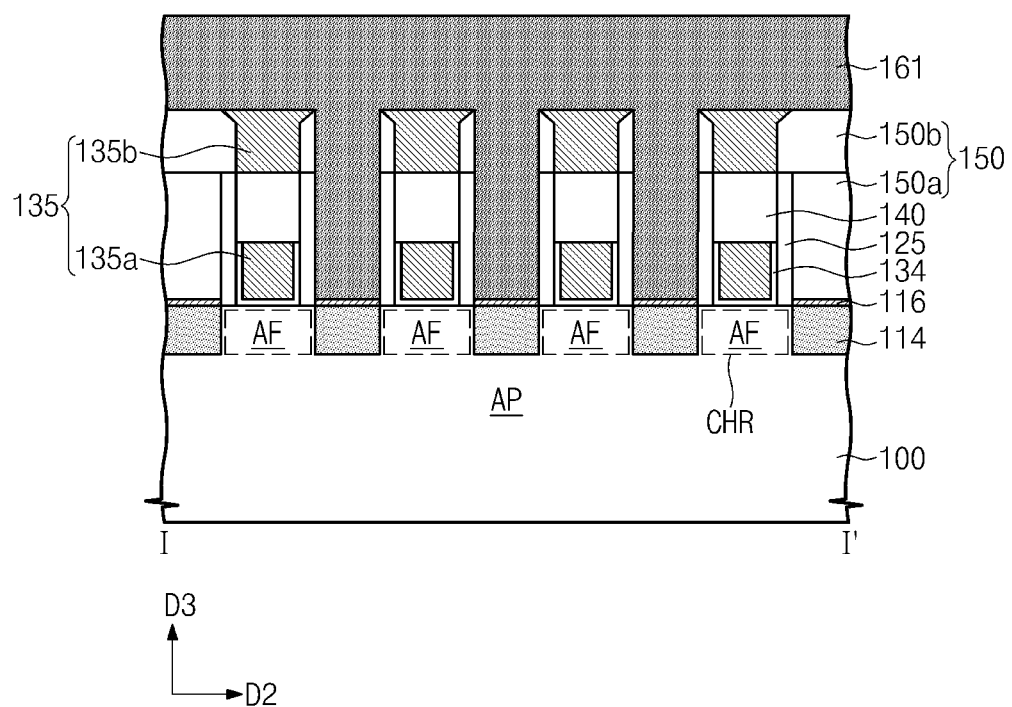
Figure 17B:
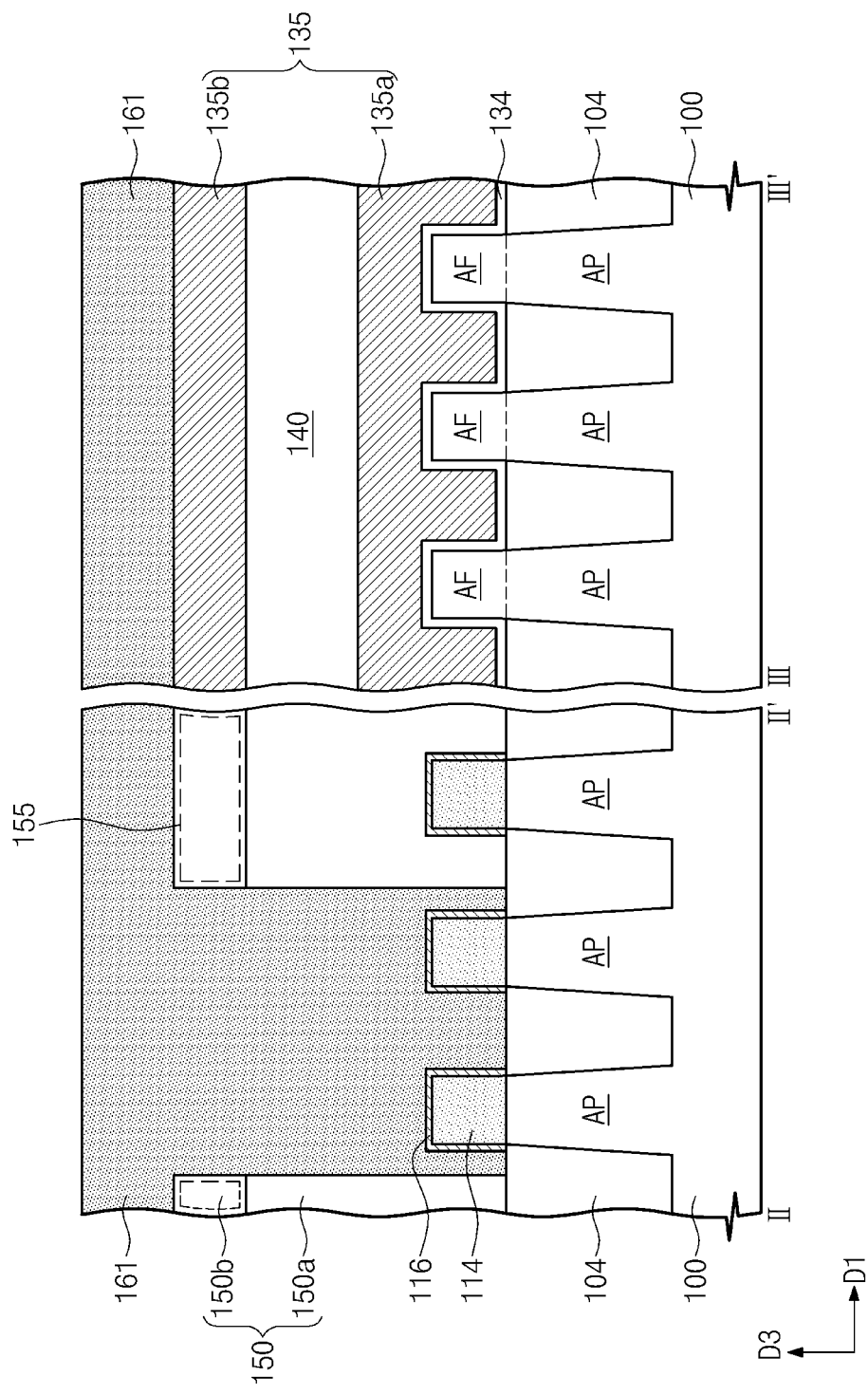

Referring to FIGS. 8A, 17A, and 17B, a second conductive layer 161 may be formed to fill the contact holes 160. The photoresist mask 170 may be removed before the formation of the second conductive layer 161.

Figure 18A:
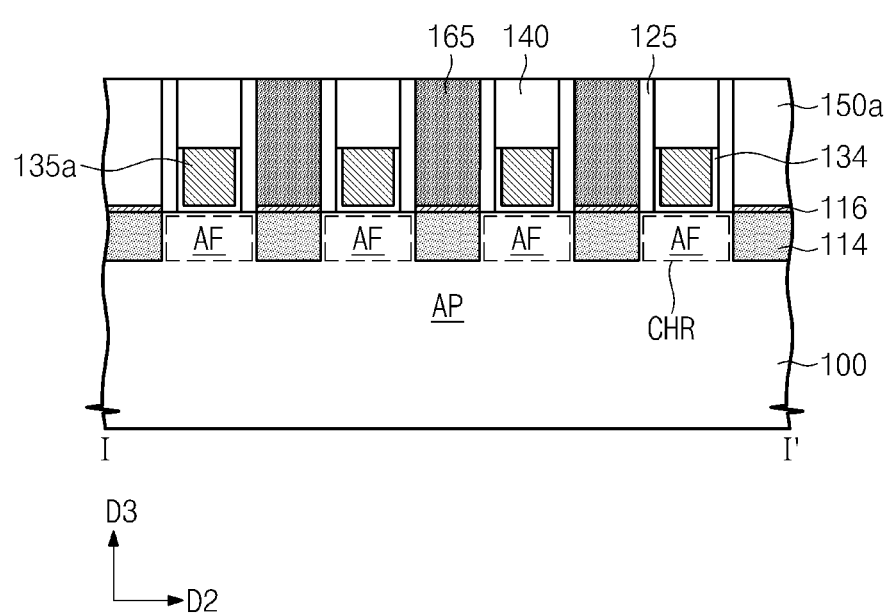
Figure 18B:
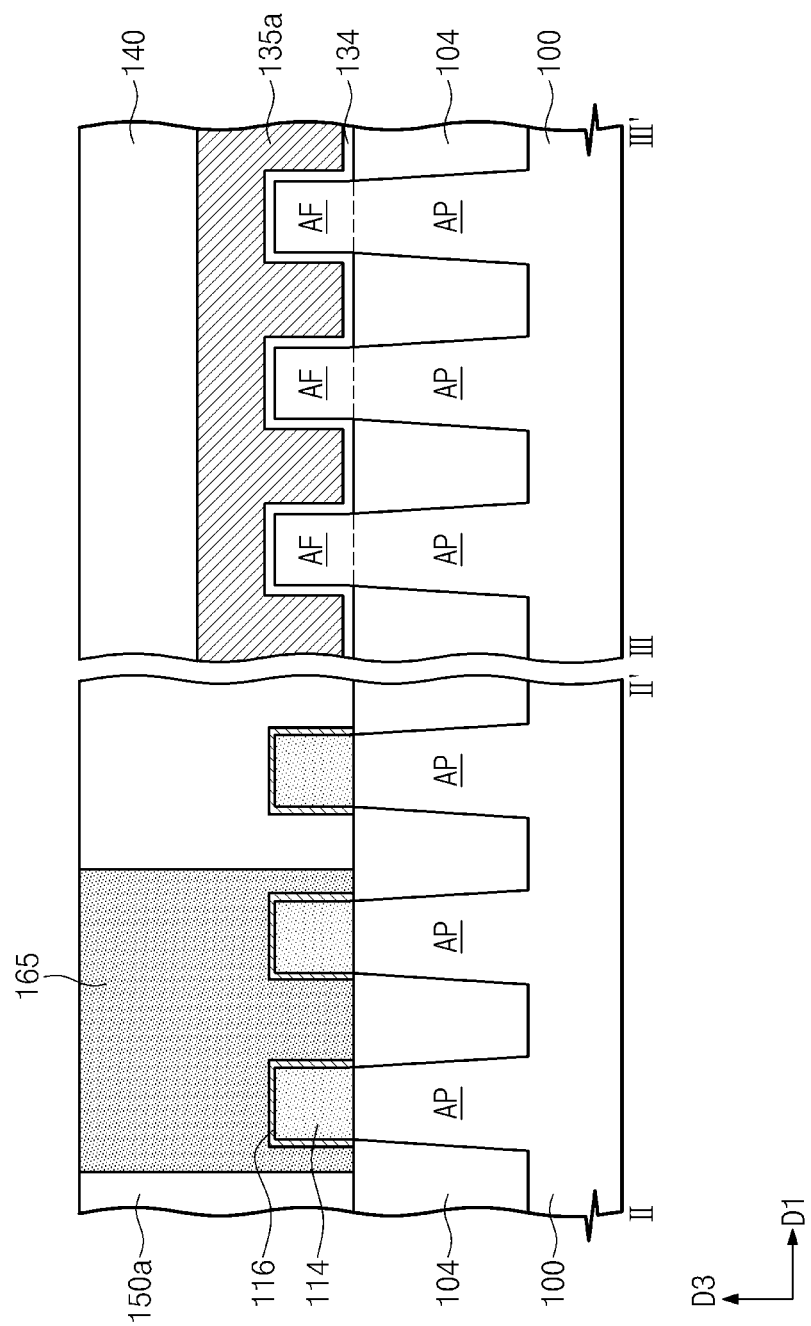

Referring to FIGS. 9A, 18A, and 18B, the second conductive layer 161 and the conductive patterns 135 may be planarized to form contact plugs 165. At the same time, all the metal hard mask portions 135b may be removed. As a result, the gate portions 135a may remain on the substrate 100. The planarization process may be performed until the top surfaces of the first capping patterns 140. Other processes of forming the contact plugs 165 may be the same as corresponding processes described with reference to FIGS. 9A, 9B, and 9C.

The metal hard mask portions 135b according to the present embodiment may be formed independently from the gate portions 135a. Thus, the metal hard mask portion 135b and the gate portion 135a may be respectively formed of conductive materials which are suitable for their purposes. For example, the metal hard mask portions 135b may be formed of a metal containing material having a high etch resistance, so the contact plugs 165 may be effectively self-aligned with the metal hard mask portions 135b. In addition, the gate portions 135a may be formed of a conductive material having a low resistance value, so an operating speed of the semiconductor device may be improved.

Even though not shown in the drawings, a second interlayer insulating layer (not shown) may be formed on an entire top surface of the substrate 100. Thereafter, connection contacts (not shown) respectively connected to the contact plugs 165 may be formed to penetrate the second interlayer insulating layer, and gate contacts (not shown) respectively connected to the gate portions 135a may be formed to penetrate the second interlayer insulating layer.

The semiconductor device according to the present embodiment will be described with reference to FIGS. 9A, 18A, and 18B. In the semiconductor device according to the present embodiment, the first capping patterns 140 may be disposed on the gate portions 135a, respectively. The first capping patterns 140 may include at least one of, for example, SiON, SiCN, SiCON, or SiN. The top surfaces of the first capping patterns 140 may be substantially coplanar with the top surfaces of the spacers 125, the top surfaces of the contact plugs 165, and the top surfaces of the interlayer insulating patterns 150a. Other elements of the semiconductor device according to the present embodiment may be the same as corresponding elements of the semiconductor device described with reference to FIGS. 9A, 9B, and 9C.

Figure 19:
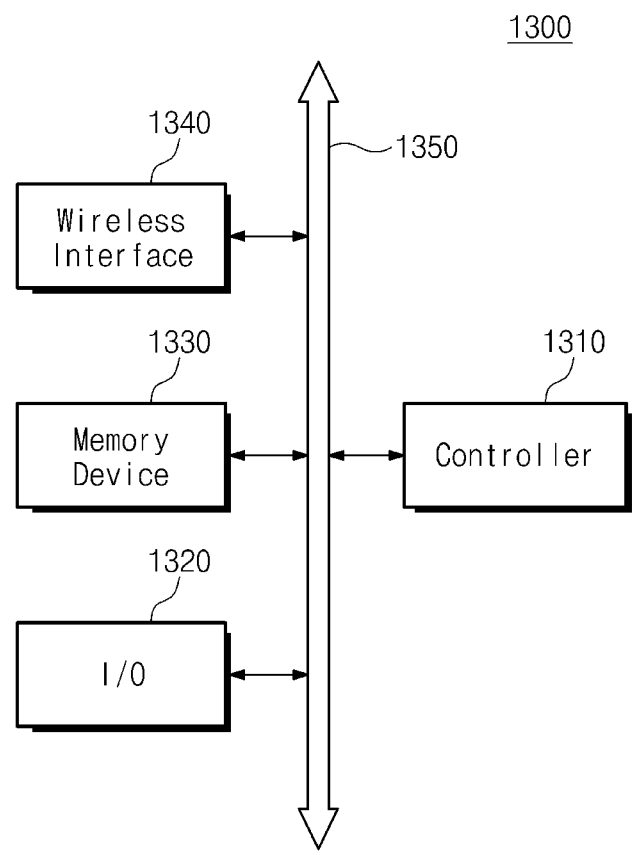
FIGS. 19 and 20 are schematic block diagrams illustrating electronic devices including semiconductor devices according to certain embodiments of the inventive concepts.
Figure 20:
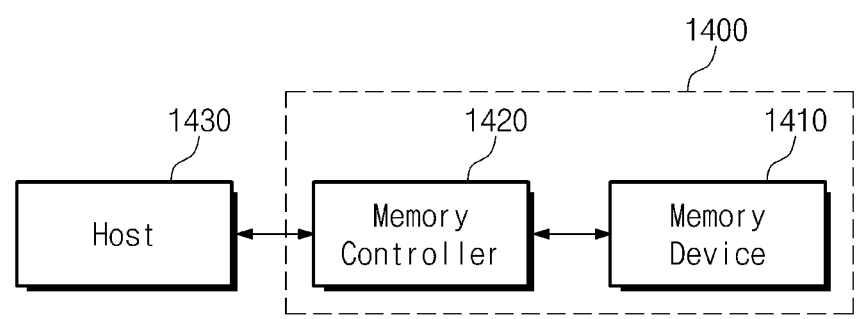

FIGS. 19 and 20 are schematic block diagrams illustrating electronic devices including semiconductor devices according to certain embodiments of the inventive concepts.

Referring to FIG. 19, an electronic device 1300 implemented with at least one of the semiconductor devices according to the above embodiments of the inventive concepts may be one of, for example, a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands to be executed by the controller 1310. Additionally, the memory device 1330 may store user's data. The memory device 1330 may include at least one of the semiconductor devices according to the aforementioned embodiments of the inventive concepts. The electronic device 1300 may transmit data to a wireless communication network using a radio frequency (RF) signal or receive data from the network by the wireless interface unit 1340. For example, the wireless interface unit 1340 may include antenna or a wireless transceiver. The electronic device 1300 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 20, the semiconductor devices according to the disclosed embodiments of the inventive concepts may be used to realize a memory system. A memory system 1400 may include a memory device 1410 and a memory controller 1420 that are used for storing massive data. The memory controller 1420 may control the memory device 1410 to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments of the inventive concepts.

According to embodiments of the inventive concepts, the self-aligned contact plugs may be effectively formed using the metal hard mask portions disposed on the gate portions. In addition, the process margin of the photoresist mask for the formation of the self-aligned contact plugs may be improved by the metal hard mask portions.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A method for manufacturing a semiconductor device, the method comprising:
  forming first and second insulating patterns on a substrate, each of the insulating patterns protruding in a direction perpendicular to a top surface of the substrate;
  forming a conductive pattern between the insulating patterns, the conductive pattern including a gate portion and a metal hard mask portion on the gate portion;
  forming a gate dielectric layer contacting a bottom of the gate portion of the conductive pattern;
  forming a first spacer between the conductive pattern and the first insulating pattern, and a second spacer between the conductive pattern and the second insulating pattern, wherein each of the spacers extends vertically from the top surface of the substrate;

forming contact holes penetrating the insulating patterns by etching the insulating patterns using the metal hard mask portion as an etch mask; and forming contact plugs filling the contact holes, respectively, wherein the gate portion and the metal hard mask portion of the conductive pattern are formed simultaneously, and wherein a top surface of the metal hard mask portion vertically overlaps with respective top surfaces of the spacers.

2. The method of claim 1, wherein each of the insulating patterns includes a protrusion, wherein a top surface of the protrusion is substantially coplanar with the top surface of the metal hard mask portion, and wherein the top surface of the protrusion is higher than the top surfaces of the spacers.

3. The method of claim 2, wherein the metal hard mask portion covers upper portions of respective first sidewalls of the spacers, the top surfaces of the spacers, and upper portions of respective first sidewalls of the insulating patterns, and wherein a first width of the metal hard mask portion at a level higher than the top surfaces of the spacers is greater than a second width of the metal hard mask portion at a level lower than the top surfaces of the spacers.

4. The method of claim 2, wherein a width of the protrusion starting at a level at the top surfaces of the spacers becomes progressively less from a bottom toward a top of the protrusion, and wherein a width of the metal hard mask portion at a level at the top surfaces of the spacers becomes progressively greater toward the top surface of the metal hard mask portion.

5. The method of claim 1, further comprising:

forming epitaxial patterns on the substrate at both sides of the conductive pattern, wherein the contact holes expose the epitaxial patterns.

6. The method of claim 5, wherein the conductive pattern is provided in plurality, wherein forming the contact holes comprises:

forming a photoresist mask on the insulating patterns and the conductive pattern, the photoresist mask including an opening that exposes portions of the metal hard mask portion and portions of the insulating patterns; and forming the contact holes using the exposed portions of the metal hard mask portion and the photoresist mask as an etch mask, wherein at least one of the contact holes vertically overlaps with at least two epitaxial patterns that are spaced apart from each other in one direction parallel to the top surface of the substrate.

7. The method of claim 1, wherein forming the conductive pattern comprises:

forming a sacrificial gate pattern on the substrate;

removing the sacrificial gate pattern to form a recess region between the spacers;

forming a metal layer filling the recess region on an entire top surface of the substrate; and planarizing the metal layer until the insulating patterns are exposed, thereby forming the gate portion and the metal hard mask portion, wherein the gate portion and the metal hard mask portion are in one united body.

8. The method of claim 7, wherein forming the contact plugs comprises:

forming a conductive layer filling the contact holes on an entire top surface of the substrate; and planarizing the conductive layer and the conductive pattern to remove the metal hard mask portion and to form the contact plugs, and wherein top surfaces of the contact plugs are substantially coplanar with a top surface of the gate portion and the top surfaces of the spacers.

9. The method of claim 1, wherein the metal hard mask portion includes a first portion and a second portion on the first portion, and wherein the second portion includes a first width at a top surface of the second portion greater than a second width at a bottom surface of the second portion.

10. The method of claim 9, wherein forming the first and second insulating patterns comprises:

forming interlayer insulating patterns covering a first sidewall of each of the spacers; and depositing a capping layer on an entire top surface of the substrate to form a first capping pattern covering a top surface of the gate portion and to form second capping patterns covering top surfaces of the interlayer insulating patterns and the top surfaces of the spacers, and wherein each of the insulating patterns includes the interlayer insulating pattern and the second capping pattern which are sequentially stacked.

11. The method of claim 10, wherein forming the conductive pattern further comprises:

forming a metal layer covering top surfaces of the first and second capping patterns; and planarizing the metal layer until the second capping patterns are exposed, thereby forming the metal hard mask portion, wherein the metal hard mask portion is vertically spaced apart from the gate portion with the first capping pattern interposed therebetween, and wherein a width of the top surface of each of the second capping patterns at the same level as the top surface of the metal hard mask portion is substantially equal to or smaller than a width of the top surface of each of the interlayer insulating patterns, when viewed from a plan view.

12. A method for manufacturing a semiconductor device, the method comprising:

forming a conductive pattern on a substrate having an active pattern, the conductive pattern including a gate portion and a metal hard mask portion on the gate portion, and the conductive pattern intersecting the active pattern;

forming a gate dielectric layer contacting a bottom of the gate portion of the conductive pattern;

forming epitaxial patterns and insulating patterns, the epitaxial patterns disposed on the substrate at opposite sides of the conductive pattern, and the insulating patterns disposed on the epitaxial patterns;

forming contact holes using the metal hard mask portion as an etch mask, the contact holes penetrating the insulating patterns and exposing the epitaxial patterns;

forming a conductive layer filling the contact holes on an entire top surface of the substrate; and planarizing the conductive layer and the conductive pattern to remove the metal hard mask portion and to form contact plugs in the contact holes at the same time, wherein the gate portion and the metal hard mask portion of the conductive pattern are formed simultaneously, and wherein the contact plugs are laterally spaced apart from the gate portion.

13. The method of claim 12, wherein the epitaxial patterns constitute first and second columns that are parallel to a first direction parallel to a top surface of the substrate, wherein the first and second columns are spaced apart from each other in a second direction intersecting the first direction, and wherein forming the contact holes comprises:
forming a photoresist mask including an opening on the insulating patterns and the conductive pattern, the opening vertically overlapping with the first and second columns; and
forming the contact holes using the photoresist mask and the metal hard mask portion exposed by the opening as an etch mask.

14. The method of claim 12, wherein forming the conductive pattern comprises:
forming a sacrificial gate pattern on the substrate;
forming a recess region that penetrates the sacrificial gate pattern and exposes a top surface of the substrate;
forming a metal layer filling the recess region on an entire top surface of the substrate; and
planarizing the metal layer until the insulating patterns are exposed, thereby forming the gate portion and the metal hard mask portion,
wherein a width of an upper portion of the metal hard mask portion is greater than a width of the gate portion.

15. The method of claim 12, wherein forming the conductive pattern comprises:
forming a recess region that exposes a top surface of the substrate;
forming the gate portion partially filling the recess region;
depositing a capping layer to form a first capping pattern filling the rest of the recess region and to form second capping patterns covering top surfaces of the insulating patterns; and
forming the metal hard mask portion covering a top surface of the first capping pattern and a first sidewall of one of the second capping patterns.

16. A method for manufacturing a semiconductor device, the method comprising:
forming first and second insulating patterns on a substrate, each of the insulating patterns protruding in a direction perpendicular to a top surface of the substrate;
forming a conductive pattern between the first and second insulating patterns;
forming a gate dielectric layer contacting a bottom of the conductive pattern;
forming a first spacer between the conductive pattern and the first insulating pattern, and a second spacer between the conductive pattern and the second insulating pattern; and
forming contact holes penetrating the insulating patterns by etching the insulating patterns using the conductive pattern,
wherein respective top surfaces of the spacers vertically overlap with a top surface of the conductive pattern such that the respective top surfaces of the spacers are vertically aligned with and below the top surface of the conductive pattern,
wherein the conductive pattern includes a first portion disposed on the substrate between the first and second spacers, a second portion on the first portion between the first and second spacers, and a third portion on the second portion between the first and second insulating patterns,
wherein a bottom surface of the first portion of the conductive pattern contacts the gate dielectric layer, and
wherein the first through third portions of the conductive pattern are formed simultaneously.

17. The method of claim 16, wherein
a bottom surface of the third portion covers the top surfaces of the spacers.

18. The method of claim 17, wherein a first width of the third portion at the top surface of the third portion is greater than a second width of the third portion at a bottom surface of the third portion, and
wherein a third width of the first portion at a bottom surface of the first portion is less than the second width.

19. The method of claim 16, further comprising:
forming a capping pattern between a first portion of the conductive pattern and a second portion of the conductive pattern, the capping pattern vertically overlapping with the first and second portions of the conductive pattern.

* * * * *